US009991163B2

(12) United States Patent
Bower et al.

(10) Patent No.: US 9,991,163 B2
(45) Date of Patent: Jun. 5, 2018

(54) SMALL-APERTURE-RATIO DISPLAY WITH ELECTRICAL COMPONENT

(71) Applicant: X-Celeprint Limited, Cork (IE)

(72) Inventors: Christopher Bower, Raleigh, NC (US); Robert R. Rotzoll, Colorado Springs, CO (US); Matthew Meitl, Durham, NC (US); Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 0 days. days.

(21) Appl. No.: 14/754,573

(22) Filed: Jun. 29, 2015

(65) Prior Publication Data

US 2016/0343771 A1 Nov. 24, 2016

Related U.S. Application Data

(60) Provisional application No. 62/164,953, filed on May 21, 2015.

(51) Int. Cl.
*H01L 21/77* (2017.01)
*G09F 9/33* (2006.01)

(52) U.S. Cl.
CPC ............... *H01L 21/77* (2013.01); *G09F 9/33* (2013.01)

(58) Field of Classification Search
None
See application file for complete search history.

(56) References Cited

U.S. PATENT DOCUMENTS

| 4,746,202 | A |   | 5/1988 | Perilloux et al. |
|-----------|---|---|--------|------------------|
| 5,060,027 | A | * | 10/1991 | Hart .................. G09F 9/33 |
|           |   |   |        | 257/779 |
| 5,550,006 | A |   | 8/1996 | Tang et al. |
| 5,621,555 | A |   | 4/1997 | Park |
| 5,625,202 | A |   | 4/1997 | Chai |

(Continued)

FOREIGN PATENT DOCUMENTS

| CN | 103677427 A | 3/2014 |
|----|-------------|--------|
| EP | 1662301 A1 | 5/2006 |

(Continued)

OTHER PUBLICATIONS

Roscher, H., VCSEL Arrays with Redundant Pixel Designs for 10Gbits/s 2-D Space-Parallel MMF Transmission, Annual Report, optoelectronics Department, (2005).

(Continued)

*Primary Examiner* — Kimberly Rizkallah
*Assistant Examiner* — Bo Bin Jang
(74) *Attorney, Agent, or Firm* — William R. Haulbrook; Alexander D. Augst; Choate, Hall & Stewart LLP

(57) ABSTRACT

A small-aperture-ratio display includes a display substrate and a plurality of spatially separated pixel elements distributed over the display substrate. Each pixel element includes one or more light emitters. An active electrical component is electrically connected to each of the pixel elements and each active electrical component is located on the display substrate at least partly between the pixel elements. The display substrate has a contiguous display substrate area that includes the pixel elements, the light emitters each have a light-emissive area, and the substrate area is greater than or equal to one-quarter the combined light-emissive areas of the light emitters.

22 Claims, 12 Drawing Sheets

(56) References Cited

U.S. PATENT DOCUMENTS

| | | | |
|---|---|---|---|
| 5,748,161 A * | 5/1998 | Lebby | H01L 25/167 257/81 |
| 5,815,303 A | 9/1998 | Berlin | |
| 5,994,722 A | 11/1999 | Averbeck et al. | |
| 6,025,730 A | 2/2000 | Akram et al. | |
| 6,084,579 A | 7/2000 | Hirano | |
| 6,087,680 A | 7/2000 | Gramann et al. | |
| 6,143,672 A | 11/2000 | Ngo et al. | |
| 6,169,294 B1 | 1/2001 | Biing-Jye et al. | |
| 6,184,477 B1 | 2/2001 | Tanahashi | |
| 6,278,242 B1 | 8/2001 | Cok et al. | |
| 6,288,824 B1 | 9/2001 | Kastalsky | |
| 6,340,999 B1 | 1/2002 | Masuda et al. | |
| 6,392,340 B2 | 5/2002 | Yoneda et al. | |
| 6,403,985 B1 | 6/2002 | Fan et al. | |
| 6,410,942 B1 | 6/2002 | Thibeault et al. | |
| 6,466,281 B1 | 10/2002 | Huang et al. | |
| 6,504,180 B1 | 1/2003 | Heremans et al. | |
| 6,577,367 B2 | 6/2003 | Kim | |
| 6,650,382 B1 | 11/2003 | Sumida et al. | |
| 6,660,457 B1 | 12/2003 | Imai et al. | |
| 6,703,780 B2 | 3/2004 | Shiang et al. | |
| 6,717,560 B2 | 4/2004 | Cok et al. | |
| 6,756,576 B1 | 6/2004 | McElroy et al. | |
| 6,812,637 B2 | 11/2004 | Cok et al. | |
| 6,828,724 B2 | 12/2004 | Burroughes | |
| 6,933,532 B2 | 8/2005 | Arnold et al. | |
| 6,969,624 B2 | 11/2005 | Iwafuchi et al. | |
| 6,975,369 B1 | 12/2005 | Burkholder | |
| 7,009,220 B2 | 3/2006 | Oohata | |
| 7,012,382 B2 | 3/2006 | Cheang et al. | |
| 7,091,523 B2 | 8/2006 | Cok et al. | |
| 7,098,589 B2 | 8/2006 | Erchak et al. | |
| 7,127,810 B2 | 10/2006 | Kasuga et al. | |
| 7,129,457 B2 | 10/2006 | McElroy et al. | |
| 7,195,733 B2 | 3/2007 | Rogers et al. | |
| 7,259,391 B2 | 8/2007 | Liu et al. | |
| 7,288,753 B2 | 10/2007 | Cok | |
| 7,402,951 B2 | 7/2008 | Cok | |
| 7,417,648 B2 | 8/2008 | Credelle | |
| 7,420,221 B2 | 9/2008 | Nagai | |
| 7,466,075 B2 | 12/2008 | Cok et al. | |
| 7,521,292 B2 | 4/2009 | Rogers et al. | |
| 7,557,367 B2 | 7/2009 | Rogers et al. | |
| 7,586,497 B2 | 9/2009 | Boroson et al. | |
| 7,605,053 B2 | 10/2009 | Couillard et al. | |
| 7,614,757 B2 | 11/2009 | Nesterenko et al. | |
| 7,622,367 B1 | 11/2009 | Nuzzo et al. | |
| 7,629,955 B2 | 12/2009 | Asao et al. | |
| 7,662,545 B2 | 2/2010 | Nuzzo et al. | |
| 7,687,812 B2 | 3/2010 | Louwsma et al. | |
| 7,704,684 B2 | 4/2010 | Rogers et al. | |
| 7,791,271 B2 | 9/2010 | Cok et al. | |
| 7,799,699 B2 | 9/2010 | Nuzzo et al. | |
| 7,816,856 B2 | 10/2010 | Cok et al. | |
| 7,834,541 B2 | 11/2010 | Cok | |
| 7,872,722 B2 | 1/2011 | Kimura | |
| 7,893,612 B2 | 2/2011 | Cok | |
| 7,898,734 B2 | 3/2011 | Coleman et al. | |
| 7,919,342 B2 | 4/2011 | Cok | |
| 7,927,976 B2 | 4/2011 | Menard | |
| 7,932,123 B2 | 4/2011 | Rogers et al. | |
| 7,943,491 B2 | 5/2011 | Nuzzo et al. | |
| 7,948,172 B2 | 5/2011 | Cok et al. | |
| 7,969,085 B2 | 6/2011 | Cok | |
| 7,972,875 B2 | 7/2011 | Rogers et al. | |
| 7,982,296 B2 | 7/2011 | Nuzzo et al. | |
| 7,990,058 B2 | 8/2011 | Cok et al. | |
| 7,999,454 B2 | 8/2011 | Winters et al. | |
| 8,004,758 B2 | 8/2011 | Coleman et al. | |
| 8,029,139 B2 | 10/2011 | Ellinger et al. | |
| 8,039,847 B2 | 10/2011 | Nuzzo et al. | |
| 8,058,663 B2 | 11/2011 | Fan et al. | |
| 8,198,621 B2 | 6/2012 | Rogers et al. | |
| 8,207,547 B2 | 6/2012 | Lin | |
| 8,243,027 B2 | 8/2012 | Hotelling et al. | |
| 8,261,660 B2 | 9/2012 | Menard | |
| 8,288,843 B2 | 10/2012 | Kojima et al. | |
| 8,334,545 B2 | 12/2012 | Levermore et al. | |
| 8,394,706 B2 | 3/2013 | Nuzzo et al. | |
| 8,440,546 B2 | 5/2013 | Nuzzo et al. | |
| 8,450,927 B2 | 5/2013 | Lenk et al. | |
| 8,470,701 B2 | 6/2013 | Rogers et al. | |
| 8,502,192 B2 | 8/2013 | Kwak et al. | |
| 8,506,867 B2 | 8/2013 | Menard | |
| 8,536,584 B2 | 9/2013 | Yao | |
| 8,581,827 B2 | 11/2013 | Park et al. | |
| 8,596,846 B2 | 12/2013 | Yankov et al. | |
| 8,619,011 B2 | 12/2013 | Kimura | |
| 8,664,699 B2 | 3/2014 | Nuzzo et al. | |
| 8,686,447 B2 | 4/2014 | Tomoda et al. | |
| 8,722,458 B2 | 5/2014 | Rogers et al. | |
| 8,735,932 B2 | 5/2014 | Kim et al. | |
| 8,754,396 B2 | 6/2014 | Rogers et al. | |
| 8,766,970 B2 | 7/2014 | Chien et al. | |
| 8,791,474 B1 | 7/2014 | Bibl et al. | |
| 8,794,501 B2 | 8/2014 | Bibl et al. | |
| 8,803,857 B2 | 8/2014 | Cok | |
| 8,817,369 B2 | 8/2014 | Daiku | |
| 8,836,624 B2 | 9/2014 | Roberts et al. | |
| 8,854,294 B2 | 10/2014 | Sakariya | |
| 8,860,051 B2 | 10/2014 | Fellows et al. | |
| 8,877,648 B2 | 11/2014 | Bower et al. | |
| 8,884,844 B2 | 11/2014 | Yang et al. | |
| 8,889,485 B2 | 11/2014 | Bower | |
| 8,895,406 B2 | 11/2014 | Rogers et al. | |
| 8,902,152 B2 | 12/2014 | Bai et al. | |
| 8,912,020 B2 | 12/2014 | Bedell et al. | |
| 8,946,760 B2 | 2/2015 | Kim | |
| 8,987,765 B2 | 3/2015 | Bibl et al. | |
| 9,048,449 B2 | 6/2015 | Kim et al. | |
| 9,105,813 B1 | 8/2015 | Chang | |
| 9,153,171 B2 | 10/2015 | Sakariya et al. | |
| 9,178,123 B2 | 11/2015 | Sakariya et al. | |
| 9,202,996 B2 | 12/2015 | Orsley et al. | |
| 9,226,361 B2 | 12/2015 | Toth | |
| 9,277,618 B2 | 3/2016 | Odnoblyudov et al. | |
| 9,308,649 B2 | 4/2016 | Golda et al. | |
| 9,329,430 B2 | 5/2016 | Erinjippurath et al. | |
| 9,343,042 B2 | 5/2016 | Miller et al. | |
| 9,368,683 B1 | 6/2016 | Meitl et al. | |
| 9,412,977 B2 | 8/2016 | Rohatgi | |
| 9,437,782 B2 | 9/2016 | Bower et al. | |
| 9,444,015 B2 | 9/2016 | Bower et al. | |
| 9,520,537 B2 | 12/2016 | Bower et al. | |
| 9,537,069 B1 | 1/2017 | Bower et al. | |
| 9,626,908 B2 | 4/2017 | Sakariya et al. | |
| 9,698,308 B2 | 7/2017 | Bower et al. | |
| 9,705,042 B2 | 7/2017 | Bower et al. | |
| 9,716,082 B2 | 7/2017 | Bower et al. | |
| 2001/0022564 A1 | 9/2001 | Youngquist et al. | |
| 2002/0096994 A1 | 7/2002 | Iwafuchi et al. | |
| 2004/0080483 A1 | 4/2004 | Chosa | |
| 2004/0180476 A1 * | 9/2004 | Kazlas | G02F 1/133305 438/146 |
| 2004/0212296 A1 | 10/2004 | Nakamura et al. | |
| 2004/0227704 A1 | 11/2004 | Wang et al. | |
| 2004/0252933 A1 | 12/2004 | Sylvester et al. | |
| 2005/0006657 A1 | 1/2005 | Terashita | |
| 2005/0012076 A1 | 1/2005 | Morioka | |
| 2005/0116621 A1 | 6/2005 | Bellmann et al. | |
| 2005/0140275 A1 | 6/2005 | Park | |
| 2005/0168987 A1 | 8/2005 | Tamaoki et al. | |
| 2005/0202595 A1 | 9/2005 | Yonehara et al. | |
| 2005/0264472 A1 * | 12/2005 | Rast | G09G 3/14 345/30 |
| 2005/0275615 A1 | 12/2005 | Kahen et al. | |
| 2005/0285246 A1 | 12/2005 | Haba et al. | |
| 2006/0051900 A1 | 3/2006 | Shizuno | |
| 2006/0063309 A1 | 3/2006 | Sugiyama et al. | |
| 2006/0273862 A1 | 12/2006 | Shimmura | |
| 2006/0289972 A1 | 12/2006 | Nishimura et al. | |
| 2007/0035340 A1 | 2/2007 | Kimura | |
| 2007/0077349 A1 | 4/2007 | Newman et al. | |

(56) References Cited

U.S. PATENT DOCUMENTS

| | | |
|---|---|---|
| 2007/0182809 A1 | 8/2007 | Yarid et al. |
| 2007/0201056 A1 | 8/2007 | Cok et al. |
| 2008/0108171 A1 | 5/2008 | Rogers et al. |
| 2008/0211734 A1 | 9/2008 | Huitema et al. |
| 2009/0045420 A1 | 2/2009 | Eng et al. |
| 2009/0146921 A1* | 6/2009 | Takahashi ............... G09F 9/33 345/55 |
| 2009/0278142 A1 | 11/2009 | Watanabe et al. |
| 2009/0295706 A1 | 12/2009 | Feng |
| 2009/0315054 A1 | 12/2009 | Kim et al. |
| 2010/0038655 A1 | 2/2010 | Chen et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0149117 A1 | 6/2010 | Chien et al. |
| 2010/0186883 A1 | 7/2010 | Tomoda |
| 2010/0190293 A1 | 7/2010 | Maeda et al. |
| 2010/0201253 A1 | 8/2010 | Cok et al. |
| 2010/0207852 A1 | 8/2010 | Cok |
| 2010/0214245 A1 | 8/2010 | Hirota |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0270912 A1 | 10/2010 | Ko |
| 2010/0289115 A1 | 11/2010 | Akiyama et al. |
| 2010/0317132 A1 | 12/2010 | Rogers et al. |
| 2010/0321414 A1 | 12/2010 | Muroi et al. |
| 2010/0328268 A1 | 12/2010 | Teranishi et al. |
| 2011/0043435 A1 | 2/2011 | Hebenstreit et al. |
| 2011/0069013 A1 | 3/2011 | Rabenstein et al. |
| 2011/0108800 A1 | 5/2011 | Pan |
| 2011/0120678 A1 | 5/2011 | Palm |
| 2011/0205448 A1 | 8/2011 | Takata |
| 2011/0211348 A1 | 9/2011 | Kim |
| 2011/0242027 A1 | 10/2011 | Chang |
| 2012/0056835 A1 | 3/2012 | Choo et al. |
| 2012/0105518 A1 | 5/2012 | Kang et al. |
| 2012/0119249 A1 | 5/2012 | Kim et al. |
| 2012/0126229 A1 | 5/2012 | Bower |
| 2012/0141799 A1 | 6/2012 | Kub et al. |
| 2012/0206428 A1 | 8/2012 | Cok |
| 2012/0206499 A1* | 8/2012 | Cok ............... G09G 3/3208 345/690 |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0236022 A1 | 9/2012 | Homma et al. |
| 2012/0256163 A1 | 10/2012 | Yoon et al. |
| 2012/0274669 A1 | 11/2012 | Neal |
| 2012/0281028 A1 | 11/2012 | Orlick et al. |
| 2012/0314388 A1 | 12/2012 | Bower et al. |
| 2012/0320566 A1 | 12/2012 | Namekata |
| 2013/0006524 A1 | 1/2013 | Sasaki et al. |
| 2013/0010405 A1* | 1/2013 | Rothkopf ............. H04M 1/0216 361/679.01 |
| 2013/0015483 A1 | 1/2013 | Shimokawa et al. |
| 2013/0016494 A1 | 1/2013 | Speier et al. |
| 2013/0036928 A1 | 2/2013 | Rogers et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0248889 A1 | 9/2013 | Lin |
| 2013/0257264 A1 | 10/2013 | Tamaki et al. |
| 2013/0273695 A1 | 10/2013 | Menard et al. |
| 2013/0278513 A1 | 10/2013 | Jang |
| 2014/0014960 A1 | 1/2014 | Yamazaki et al. |
| 2014/0082934 A1 | 3/2014 | Cok |
| 2014/0084482 A1 | 3/2014 | Hu et al. |
| 2014/0085214 A1 | 3/2014 | Cok |
| 2014/0104157 A1* | 4/2014 | Burns ............... H01Q 1/243 345/156 |
| 2014/0104243 A1 | 4/2014 | Sakariya et al. |
| 2014/0111442 A1 | 4/2014 | Cok et al. |
| 2014/0146273 A1 | 5/2014 | Kim et al. |
| 2014/0159043 A1 | 6/2014 | Sakariya et al. |
| 2014/0159065 A1 | 6/2014 | Hu et al. |
| 2014/0175498 A1 | 6/2014 | Lai |
| 2014/0183446 A1 | 7/2014 | Nago et al. |
| 2014/0197509 A1 | 7/2014 | Haddad et al. |
| 2014/0198373 A1 | 7/2014 | Ray |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0240617 A1 | 8/2014 | Fukutome et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0339495 A1 | 11/2014 | Bibl et al. |
| 2014/0340900 A1 | 11/2014 | Bathurst et al. |
| 2014/0367633 A1 | 12/2014 | Bibl et al. |
| 2014/0367705 A1 | 12/2014 | Bibl et al. |
| 2015/0003040 A1 | 1/2015 | Bessho et al. |
| 2015/0021632 A1 | 1/2015 | Taghizadeh et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0179453 A1 | 6/2015 | Cheng et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0296580 A1 | 10/2015 | Kim et al. |
| 2015/0308634 A1 | 10/2015 | van de Ven et al. |
| 2015/0327388 A1 | 11/2015 | Menard et al. |
| 2015/0362165 A1 | 12/2015 | Chu et al. |
| 2015/0370130 A1 | 12/2015 | Lin |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372187 A1 | 12/2015 | Bower et al. |
| 2015/0373793 A1 | 12/2015 | Bower et al. |
| 2016/0004123 A1 | 1/2016 | Tanabe |
| 2016/0005721 A1 | 1/2016 | Bower et al. |
| 2016/0018094 A1 | 1/2016 | Bower et al. |
| 2016/0056725 A1 | 2/2016 | Kim et al. |
| 2016/0057822 A1 | 2/2016 | Chu |
| 2016/0057827 A1 | 2/2016 | Miskin |
| 2016/0057832 A1 | 2/2016 | Briggs et al. |
| 2016/0064363 A1 | 3/2016 | Bower et al. |
| 2016/0085120 A1 | 3/2016 | Xu |
| 2016/0093600 A1 | 3/2016 | Bower et al. |
| 2016/0131329 A1 | 5/2016 | Park et al. |
| 2016/0260388 A1 | 9/2016 | Yata et al. |
| 2016/0266697 A1 | 9/2016 | Cheng et al. |
| 2016/0343772 A1 | 11/2016 | Bower et al. |
| 2016/0351529 A1 | 12/2016 | Bower et al. |
| 2016/0364030 A1 | 12/2016 | Peana et al. |
| 2017/0005244 A1 | 1/2017 | Bower et al. |
| 2017/0025075 A1 | 1/2017 | Cok et al. |
| 2017/0025484 A1 | 1/2017 | Forrest et al. |
| 2017/0047393 A1 | 2/2017 | Bower et al. |
| 2017/0048976 A1 | 2/2017 | Prevatte et al. |
| 2017/0061842 A1 | 3/2017 | Cok et al. |
| 2017/0068362 A1 | 3/2017 | Den Boer et al. |
| 2017/0092863 A1 | 3/2017 | Bower et al. |
| 2017/0102797 A1 | 4/2017 | Cok |
| 2017/0122502 A1 | 5/2017 | Cok et al. |
| 2017/0133818 A1 | 5/2017 | Cok |
| 2017/0167703 A1 | 6/2017 | Cok |
| 2017/0186740 A1 | 6/2017 | Cok et al. |
| 2017/0187976 A1 | 6/2017 | Cok |
| 2017/0206845 A1 | 7/2017 | Sakariya et al. |
| 2017/0250219 A1 | 8/2017 | Bower et al. |
| 2017/0256521 A1 | 9/2017 | Cok et al. |

(56) References Cited

U.S. PATENT DOCUMENTS

| | | |
|---|---|---|
| 2017/0256522 A1 | 9/2017 | Cok et al. |
| 2017/0287882 A1 | 10/2017 | Cok et al. |

FOREIGN PATENT DOCUMENTS

| | | |
|---|---|---|
| EP | 2078978 A2 | 7/2009 |
| EP | 2148264 A2 | 1/2010 |
| EP | 2 610 314 A1 | 7/2013 |
| EP | 2703969 A2 | 3/2014 |
| GB | 2 496 183 A | 5/2013 |
| JP | 11-142878 | 5/1999 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/132552 A1 | 11/2010 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |
| WO | WO-2015/088629 A1 | 6/2015 |
| WO | WO-2015/193434 A2 | 12/2015 |
| WO | WO-2016/030422 A1 | 3/2016 |
| WO | WO-2016/046283 A2 | 3/2016 |
| WO | WO-2017/042252 A1 | 3/2017 |
| WO | WO-2017/060487 A2 | 4/2017 |
| WO | WO-2017/060487 A3 | 5/2017 |
| WO | WO-2017/060487 A4 | 7/2017 |
| WO | WO-2017/149067 A1 | 9/2017 |
| WO | WO-2017/174632 A1 | 10/2017 |

OTHER PUBLICATIONS

Yaniv et al., A 640×480 Pixel Computer Display Using Pin Diodes with Device Redundancy, 1988 International Display Research Conference, IEEE, CH-2678-1/88:152-154 (1988).

Choi, H. W. et al., Efficient GaN-based Micro-LED Arrays, Mat. Res. Soc. Symp. Proc. 743:L6.28.1-L6.28.6 (2003).

International Search Report, PCT/EP2015/063709, dated Dec. 15, 2015, 6 pages.

International Search Report, PCT/EP2015/069553, dated Nov. 27, 2015, 6 pages.

Lee, S. H. etal, Laser Lift-Offof GaN Thin Film and its Application to the Flexible Light Emitting Diodes, Proc. of SPIE 8460:846011-1-846011-6 (2012).

Poher, V. et al., Micro-LED arrays: a tool for two-dimensional neuron stimulation, J. Phys. D: Appl. Phys. 41:094014 (2008).

U.S. Appl. No. 14/788,632, filed Jun. 30, 2015, X-Celeprint Limited.

U.S. Appl. No. 14/807,311, filed Jul. 23, 2015, X-Celeprint Limited.

U.S. Appl. No. 14/822,866, filed Aug. 10, 2015, Bower et al.

Cok, R. S. et al., AMOLED displays with transfer-printed integrated circuits, Journal of SID 19/(4):335-341(2011).

Hamer et al., 63.2: AMOLED Displays Using Transfer-Printed Integrated Circuits, SID 09 Digest, 40(2):947-950 (2009).

Johnson, K. et al., Advances in Red VCSEL Technology, Advances in Optical Technologies, 2012:569379, 13 pages (2012).

Kasahara, D. et al., Nichia reports first room-temperature blue/'green' VCSELs with current injection, Appl. Phys. Express, 4(7):3 pages (2011).

Koma, N. et al., 44.2: Novel Front-light System Using Fine-pitch Patterned OLED, SID, 08:655-658 (2008).

Matioli, E. et al., High-brightness polarized light-emitting diodes, Light: Science & Applicaitons, 1:e22:1-7 (2012).

Seurin, J. F. et al, High-power red VCSEL arrays, Proc. of SPIE 8639:1-9 (2013).

Yoon, J. et al., Heterogeneously Integrated Optoelectronic Devices Enabled by MicroTransfer Printing, Adv. Optical Mater. 3:1313-1335 (2015).

* cited by examiner

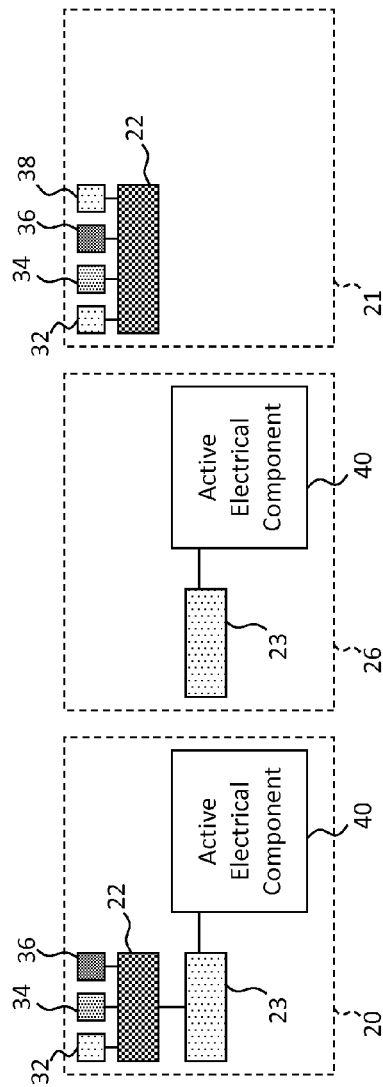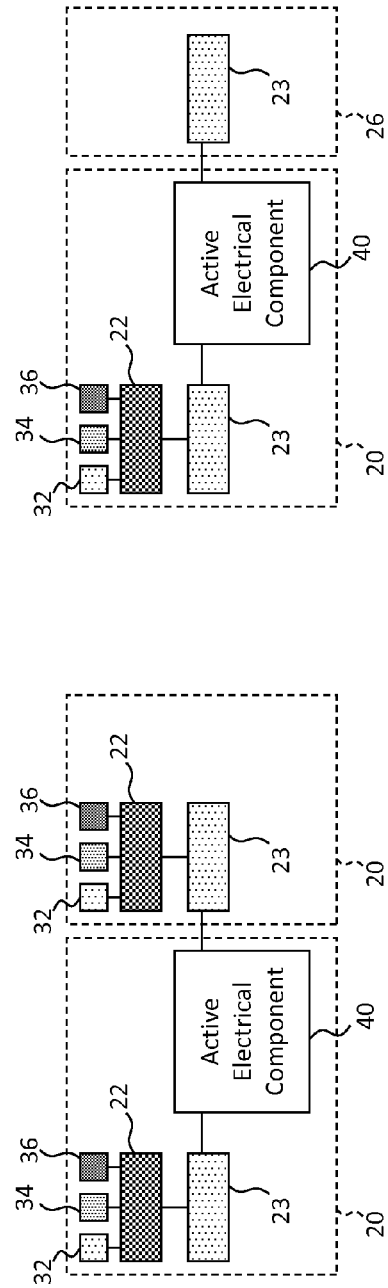

SMALL-APERTURE-RATIO DISPLAY WITH ELECTRICAL COMPONENT

PRIORITY APPLICATION

This application claims priority to and the benefit of U.S. Provisional Patent Application No. 62/164,953, filed May 21, 2015, titled "Small-Aperture-Ratio Display with Electrical Component," the contents of which are incorporated by reference herein in its entirety.

CROSS REFERENCE TO RELATED APPLICATIONS

Reference is made to U.S. patent application Ser. No. 62/055,472 filed Sep. 25, 2014, entitled Compound Micro-Assembly Strategies and Devices, and to U.S. patent application Ser. No. 62/148,603 filed Apr. 16, 2015, entitled Micro-Assembled Micro LED Displays and Lighting Elements, the contents of each of which are incorporated by reference herein in their entirety.

FIELD OF THE INVENTION

The present invention relates to a display having a small aperture ratio and a display substrate with distributed light emitters.

BACKGROUND OF THE INVENTION

Flat-panel displays are widely used in conjunction with computing devices, in portable devices, and for entertainment devices such as televisions. Such displays typically employ a plurality of pixels distributed over a display substrate to display images, graphics, or text. In a color display, each pixel includes light emitters that emit light of different colors, such as red, green, and blue. For example, liquid crystal displays (LCDs) employ liquid crystals to block or transmit light from a backlight behind the liquid crystals and organic light-emitting diode displays rely on passing current through a layer of organic material that glows in response to the current. Displays are typically controlled with either a passive-matrix (PM) control employing electronic circuitry external to the display substrate or an active-matrix (AM) control employing electronic circuitry formed directly on the display substrate and associated with each light-emitting element. Both OLED and LC displays using both passive-matrix control and active-matrix control are available. An example of such an AM OLED display device is disclosed in U.S. Pat. No. 5,550,066.

Active-matrix circuitry is commonly achieved by forming thin-film transistors (TFTs) in a semiconductor layer formed over a display substrate and employing a separate TFT circuit to control each light-emitting pixel in the display. The semiconductor layer is typically amorphous silicon or polycrystalline silicon and is distributed over the entire flat-panel display substrate. The semiconductor layer is photolithographically processed to form electronic control elements, such as transistors and capacitors. Additional layers, for example insulating dielectric layers and conductive metal layers are provided, often by evaporation or sputtering, and photolithographically patterned to form electrical interconnections, or wires.

Typically, each display sub-pixel is controlled by one control element, and each control element includes at least one transistor. For example, in a simple active-matrix organic light-emitting diode (OLED) display, each control element includes two transistors (a select transistor and a power transistor) and one capacitor for storing a charge specifying the luminance of the sub-pixel. Each OLED element employs an independent control electrode connected to the power transistor and a common electrode. In contrast, an LCD typically uses a single transistor to control each pixel. Control of the light-emitting elements is usually provided through a data signal line, a select signal line, a power connection and a ground connection. Active-matrix elements are not necessarily limited to displays and can be distributed over a substrate and employed in other applications requiring spatially distributed control.

The amount of light emitted from an LCD is determined by the brightness of the backlight, the transmissivity of the liquid crystals, and the area of the display through which light is emitted. A larger pixel area will transmit more light than a smaller pixel area. Hence, in order to achieve a desirably bright LCD, the pixel areas are preferably large. In contrast, the brightness of an OLED display depends on the current density passed through the OLED pixels. At higher current densities, brightness is increased and lifetime is decreased. Thus, a larger light-emitting OLED area will increase the lifetime of an OLED display by reducing the current density or enable an increased current and brightness without increasing the current density or reducing the OLED lifetime. It is therefore also preferred that OLED pixels are large.

The percentage of a display area that is given over to the actual light-controlling pixel area is known as the aperture ratio or fill factor. A larger aperture ratio typically results in a longer lifetime or a greater maximum brightness for a flat-panel display. Low aperture ratios are especially problematic for displays in which the light-controlling elements (e.g. light-transmissive or light-emitting elements) are located on the same substrate as the active control elements (such as thin-film transistors), for example a bottom-emitting OLED display in which the display substrate area is shared between the control circuits and the light-emitting area. Active-matrix LC displays suffer from the same problem and, in addition, the active control elements are located between the light emitter (the backlight) and a viewer. In an active-matrix LC display the TFTs are located between a viewer and the backlight and occupy space on the control substrate. In both cases, an increased brightness is required for a given display brightness when the aperture ratio of the display is relatively smaller. The increased brightness results in a reduced lifetime. Thus, in both cases, a larger aperture ratio is preferred.

Inorganic light-emitting diode displays using micro-LEDs (for example having an area less than 1 mm square, less than 100 microns square, or less than 50 microns square or having an area small enough that it is not visible to an unaided observer of the display at a designed viewing distance) are also known. For example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate.

Displays often incorporate or are used in combination with other technologies that enhance the usefulness of the combined system. In particular, many portable display systems include touch screens. Users view information on the display and then indicate an associated action by physically touching a screen located over the display where the information is displayed. The touch is detected by an external controller and the appropriate action corresponding to the displayed information is taken.

Although displays with associated functionality are widespread in the computing and telecommunications industries, there remains a need for display systems, structures, and methods of manufacturing that provide increased lifetime, image quality, ease of manufacturing, reduced cost and improved functionality in simpler and more robust structures.

SUMMARY OF THE INVENTION

The present invention provides a display having a small aperture ratio with distributed pixel elements having light emitters and active electrical components electrically connected to each of the pixel elements. Each active electrical component is located on the display substrate at least partly between the pixel elements. The display substrate has a display substrate area that includes the pixel elements and the light emitters each have a light-emissive area. The display has a small aperture ratio as the combined light-emissive areas of the light emitters is less than or equal to one-quarter of the display substrate area.

According to embodiments of the present invention, an inorganic light emitter such as an LED provides high-brightness light (for example having an efficiency or brightness greater than incandescent, fluorescent, or OLED light emitters) output without depending on a relatively large light-controlling area and without restrictions on viewing angle, thus providing increased lifetime and image quality. By printing light emitters formed in a crystalline semiconductor wafer onto a display substrate using conventional materials and processes, costs are reduced and functionality improved. Light-emitting diodes occupy relatively less area on a display substrate, providing space to construct or otherwise provide additional circuits and devices on the display substrate, increasing the functionality of the small-aperture-ratio device. Among other things, the small-aperture-ratio display provides increased lifetime, image quality, ease of manufacturing, and reduced cost and improved functionality in a simpler and more robust structure.

The disclosed technology, in certain embodiments, includes a small-aperture-ratio display, including: a display substrate; a plurality of spatially separated pixel elements distributed over the display substrate, each pixel element including one or more light emitters; an active electrical component electrically connected to each of the pixel elements, each active electrical component located on the display substrate at least partly between the pixel elements; and wherein the display substrate has a contiguous display substrate area that includes the pixel elements, the light emitters each have a light-emissive area, and the combined light-emissive areas of the light emitters is less than or equal to one-quarter of the contiguous display substrate area.

In certain embodiments, the active electrical component is an inductor, a capacitor, an integrated capacitive charge pump, a force-sensitive element, a transistor, a thin-film transistor, a circuit, a logic circuit, a power circuit, an antenna, is a multi-functional electrical component, or includes multiple active electrical elements.

In certain embodiments, the force-sensitive element is a piezo-electric or piezo-ionic element.

In certain embodiments, the one or more capacitors stores a charge corresponding to a luminance of at least one of the one or more light emitters of the pixel element to which the capacitor is electrically connected.

In certain embodiments, the pixel elements form a regular array on the display substrate.

In certain embodiments, each pixel element includes a single light emitter.

In certain embodiments, each pixel element includes at least three light emitters, each of the at least three light emitters emitting light of different colors.

In certain embodiments, the display includes a plurality of pixel substrates on the display substrate and wherein each of the plurality of pixel elements is located on one of the plurality of pixel substrates.

In certain embodiments, each pixel element includes a pixel controller and the pixel controller is electrically connected to the active electrical component and to the one or more light emitters to control the light output by the one or more light emitters and to control the active electrical component.

In certain embodiments, the pixel controller is located on the display substrate.

In certain embodiments, the display includes a pixel substrate separate from the display substrate and wherein the pixel controller is located on the pixel substrate.

In certain embodiments, a pixel substrate separate from the display substrate and wherein the pixel elements are located on the pixel substrate and the pixel substrate is located on the display substrate.

In certain embodiments, one or more conductive wires electrically connect two or more of the pixel elements.

In certain embodiments, the one or more conductive wires conduct signals for controlling the pixel elements, for conducting power to the pixel elements, or for providing a ground reference voltage.

In certain embodiments, the active electrical component is an inductor or integrated capacitive charge pump and each pixel element includes a power-control circuit providing power to the one or more light emitters, the power-control circuit electrically connected to the inductor or integrated capacitive charge pump.

In certain embodiments, the combined light-emissive areas of the light emitters is less than or equal to one eighth, one tenth, one twentieth, one fiftieth, one hundredth, one five-hundredth, one thousandth, one two-thousandth, or one ten-thousandth of the contiguous display substrate area.

In certain embodiments, the active electrical component is an antenna and the antennas form a beam-steering antenna array.

In certain embodiments, the active electrical component corresponding to each pixel element is located within an area bounded by the neighboring pixel elements adjacent to each pixel element.

In certain embodiments, the one or more light emitters are formed in or located on the display substrate.

In certain embodiments, each light emitter is formed in or on a pixel substrate separate from the display substrate.

In certain embodiments, the pixel substrate is located on the display substrate.

In certain embodiments, the light emitters emit light through the display substrate.

In certain embodiments, each of the plurality of inorganic micro light-emitting diodes has a width from 2 to 5 µm, 5 to 10 µm, 10 to 20 µm, or 20 to 50 µm.

In certain embodiments, each of the plurality of inorganic micro light-emitting diodes has a length from 2 to 5 µm, 5 to 10 µm, 10 to 20 µm, or 20 to 50 µm.

In certain embodiments, each of the plurality of inorganic micro light-emitting diodes has a height from 2 to 5 µm, 4 to 10 µm, 10 to 20 µm, or 20 to 50 µm.

The disclosed technology, in certain embodiments, includes a small-aperture-ratio display, the display including: a display substrate including a plurality of pixels distributed on a first surface of the display substrate, each pixel including three or more light emitters of a plurality of light emitters on the display substrate, wherein: the plurality of light emitters includes: a plurality of red printed micro inorganic light-emitting diodes that emit red light, a plurality of green printed micro inorganic light-emitting diodes that emit green light, and a plurality of blue printed micro inorganic light-emitting diodes that emit blue light; wherein each pixel of the plurality of pixels includes a red printed micro inorganic light-emitting diode of the plurality of red printed micro inorganic light-emitting diodes, a green printed micro inorganic light-emitting diode of the plurality of green printed micro inorganic light-emitting diodes, and a blue printed micro inorganic light-emitting diode of the plurality of blue printed micro inorganic light-emitting diodes; the plurality of light emitters occupy a light-emissive area on the first surface; the light-emissive area has a total area less than or equal to one-quarter of an area of the first surface of the display substrate; and wherein the display substrate is non-native to the plurality of light emitters.

In certain embodiments, the display substrate is at least one of plastic, glass, and sapphire.

In certain embodiments, the display substrate is transparent to visible light.

In certain embodiments, the display substrate is at least partially transparent to visible light.

In certain embodiments, the small-aperture-ratio display has no less than 30 percent transparency to visible light (e.g., transparent; e.g., no less than 50%, 80%, 90%, or 95% transparency to visible light)

In certain embodiments, each pixel includes: a printed pixel element of a plurality of printed pixel elements disposed on the display substrate, each printed pixel element of the plurality of printed pixel elements including: a pixel substrate of a plurality of pixel substrates on which the micro inorganic light-emitting diodes for a respective pixel are disposed, and a fine interconnection having a width of 100 nm to 1 µm electrically connected to the micro inorganic light-emitting diodes for the respective pixel.

In certain embodiments, the display includes one or more crude lithography interconnections having a width from 2 µm to 2 mm, wherein each crude lithography interconnection is electrically connected to at least one of the plurality of pixel elements on the display substrate.

In certain embodiments, the plurality of light emitters includes a plurality of yellow printed micro inorganic light-emitting diodes that emit yellow light, and wherein each pixel of the plurality of pixels includes a yellow printed micro inorganic light-emitting diode of the plurality of yellow printed micro inorganic light-emitting diodes that emit yellow light.

In certain embodiments, one or more capacitors store a charge corresponding to a luminance of the light emitter of at least one of the one or more light emitters of the pixel to which the capacitor is electrically connected.

In certain embodiments, the plurality of pixels forms an array on the display substrate.

In certain embodiments, one or more conductive wires electrically connect two or more of the pixels.

In certain embodiments, the one or more conductive wires conduct signals for controlling the pixels connected thereto, for conducting power to the pixel connected thereto, or for providing a ground reference voltage.

In certain embodiments, the combined light-emissive areas of the light emitters is less than or equal to one eighth, one tenth, one twentieth, one fiftieth, one hundredth, one five-hundredth, one thousandth, one two-thousandth, or one ten-thousandth of the area of the first surface of the display substrate area.

In certain embodiments, the plurality of light emitters emits light through the display substrate.

In certain embodiments, the display includes a plurality of active electrical components disposed on the display substrate, each of said active electrical components electrically connected to one or more light emitters of a respective pixel.

In certain embodiments, each active electrical component of the plurality of active electrical components is an inductor, a capacitor, an integrated capacitive charge pump, a force-sensitive element, a transistor, a thin-film transistor, a circuit, a logic circuit, a power circuit, an antenna, a multi-functional electrical component, or includes multiple active electrical elements.

In certain embodiments, each active electrical component of the plurality of active components is a piezo-electric element.

In certain embodiments, the plurality of active electrical components includes a plurality of antennas that collectively form a beam-steering antenna array.

In certain embodiments, each active electrical component of the plurality of active electrical components is an inductor or integrated capacitive charge pump, and each pixel includes a power-control circuit connected to the active electrical component and providing power to one of the light emitters.

In certain embodiments, the display includes a plurality of pixel controllers on the display substrate, each pixel controller controlling a light output by the light emitter in the respective pixel.

In certain embodiments, each of the plurality of inorganic micro light-emitting diodes has a width from 2 to 5 µm, 5 to 10 µm, 10 to 20 µm, or 20 to 50 µm.

In certain embodiments, each of the plurality of inorganic micro light-emitting diodes has a length from 2 to 5 µm, 5 to 10 µm, 10 to 20 µm, or 20 to 50 µm.

In certain embodiments, each of the plurality of inorganic micro light-emitting diodes has a height from 2 to 5 µm, 4 to 10 µm, 10 to 20 µm, or 20 to 50 µm.

The disclosed technology, includes a method of micro assembling an inorganic light-emitting diode (LED) display, the method including: forming a plurality of printable inorganic micro LEDs, wherein the plurality of printable micro inorganic LEDs includes: a plurality of red printed micro inorganic light-emitting diodes that emit red light; a plurality of green printed micro inorganic light-emitting diodes that emit green light; and a plurality of blue printed micro inorganic light-emitting diodes that emit blue light; micro transfer printing the plurality of printable micro LEDs onto a non-native substrate to form a plurality of pixels; wherein: each pixel includes a red printed micro inorganic light-emitting diode of the plurality of red printed micro inorganic light-emitting diodes, a green printed micro inorganic light-emitting diode of the plurality of green printed micro inorganic light-emitting diodes, and a blue printed micro inorganic light-emitting diode of the plurality of blue printed micro inorganic light-emitting diodes, and the non-native substrate is non-native to the plurality of printable micro LEDs; the plurality of light emitters occupy a light-emissive area on the first surface, the light-emissive area has a total area less than or equal to one-quarter of an area of the first surface of the display substrate.

In certain embodiments, the display substrate is at least one of plastic, glass, and sapphire.

In certain embodiments, the display substrate is transparent to visible light.

In certain embodiments, the display substrate is at least partially transparent to visible light.

In certain embodiments, the display has no less than 30 percent transparency to visible light (e.g., transparent; e.g., no less than 50%, 80%, 90%, or 95% transparency to visible light).

In certain embodiments, each pixel includes a printed micro-system of a plurality of printed micro-systems disposed on the display substrate, each printed micro-system of the plurality of printed micro-systems including: a pixel substrate of a plurality of pixel substrates on which the printed micro inorganic light-emitting diodes for a respective pixel are disposed, and a fine interconnection having a width of 100 nm to 1 μm electrically connected to the at least one of the micro inorganic light-emitting diodes for the respective pixel.

In certain embodiments, the display includes one or more crude lithography interconnections having a width from 2 μm to 2 mm, wherein each crude lithography interconnection is electrically connected to at least one of the plurality of micro-systems on the display substrate.

In certain embodiments, the plurality of printable inorganic micro LEDs includes a plurality of yellow micro inorganic light-emitting diodes, wherein each pixel of the plurality of pixels includes a yellow printed micro inorganic light-emitting diode of the plurality of yellow printed micro inorganic light-emitting diodes.

In certain embodiments, one or more capacitors store a charge corresponding to a luminance of at least one of the plurality of printable inorganic micro LEDs to which the capacitor is electrically connected.

In certain embodiments, the plurality of pixels forms an array on the display substrate.

In certain embodiments, one or more conductive wires electrically connect two or more of the pixels.

In certain embodiments, the one or more conductive wires conduct signals for controlling the pixels connected thereto, for conducting power to the pixel connected thereto, or for providing a ground reference voltage.

In certain embodiments, the combined light-emissive areas of the light emitters is less than or equal to one eighth, one tenth, one twentieth, one fiftieth, one hundredth, one five-hundredth, one thousandth, one two-thousandth, or one ten-thousandth of the area of the first surface of the display substrate area.

In certain embodiments, the plurality of light emitters emits light through the display substrate.

In certain embodiments, the display includes micro transfer printing a plurality of active electrical components on the display substrate, and electrically connecting each of said active electrical components to a respective one or more micro inorganic light-emitting diodes of a respective pixel.

In certain embodiments, each active electrical component of the plurality of active electrical components is an inductor, a capacitor, an integrated capacitive charge pump, a force-sensitive element, a transistor, a thin-film transistor, a circuit, a logic circuit, a power circuit, an antenna, a multi-functional electrical component, or includes multiple active electrical elements.

In certain embodiments, each active electrical component of the plurality of active components is a piezo-electric element.

In certain embodiments, the plurality of active electrical components includes a plurality of antennas that collectively form a beam-steering antenna array.

In certain embodiments, each active electrical component of the plurality of active electrical components is an inductor or integrated capacitive charge pump; and each pixel includes a power-control circuit connected to the active electrical component and providing power to one of plurality of printable inorganic micro LEDs.

In certain embodiments, the plurality of active electrical components includes a plurality of pixel controllers on the display substrate, each pixel controller controlling a light output by one or more micro inorganic light-emitting diodes in the respective pixel.

In certain embodiments, each of the plurality of inorganic micro light-emitting diodes has a width from 2 to 5 μm, 5 to 10 μm, 10 to 20 μm, or 20 to 50 μm.

In certain embodiments, each of the plurality of inorganic micro light-emitting diodes has a length from 2 to 5 μm, 5 to 10 μm, 10 to 20 μm, or 20 to 50 μm.

In certain embodiments, each of the plurality of inorganic micro light-emitting diodes has a height from 2 to 5 μm, 4 to 10 μm, 10 to 20 μm, or 20 to 50 μm.

In certain embodiments, the electrical component is an analog electrical component or circuit.

In certain embodiments, the electrical component is a digital electrical component or circuit.

In certain embodiments, all of the pixel elements are identical.

In certain embodiments, the non-component pixel elements are interspersed between the pixel elements over the display substrate.

In certain embodiments, the pixel elements comprise first pixel elements that are different from second pixel elements.

In certain embodiments, the display includes non-light-emitting component elements that are each electrically connected to an active electrical component.

In certain embodiments, the display includes non-component pixel elements that are not electrically connected to an active electrical component.

In certain embodiments, the non-light-emitting component elements are interspersed between the pixel elements over the display substrate.

In certain embodiments, an active electrical component is electrically connected to a pixel element and to a non-light-emitting component element.

In certain embodiments, two or more pixel elements are connected to a common active electrical component.

In certain embodiments, each active electrical component is located on the substrate in an area that extends beyond the area bounded by pixel elements that are neighbors to the pixel element to which the active electrical component is connected.

In certain embodiments, two or more of the active electrical components are first and second active electrical components and wherein the first active electrical component is different from the second active electrical component.

In certain embodiments, the active electrical components comprise one or more first active electrical components and one or more second active electrical components different from the first active electrical components.

In certain embodiments, the first and second active electrical components have different functionality, have a different size, or comprise different materials.

In certain embodiments, the first electrical components are interspersed between the second active electrical components over the display substrate.

In certain embodiments, the display substrate comprises different first and second portions and wherein the first electrical components are located in the first portion and the second active electrical components are located in the second portion.

In certain embodiments, at least some of the pixel elements have an irregular arrangement on the display substrate.

In certain embodiments, each pixel element comprises a pixel controller and the pixel controller is electrically connected to the active electrical component and to the one or more light emitters to control the light output by the one or more light emitters and to control the active electrical component and wherein the active electrical component is a touch sensor and the pixel controller further comprises a touch sensing circuit.

In certain embodiments, the active electrical component is a capacitor forming a self-capacitance sensor.

In certain embodiments, the active electrical component comprises two electrical conductors forming a mutual-capacitance sensor.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 12-16 are schematics of various embodiments of the present invention.

Figure 1:
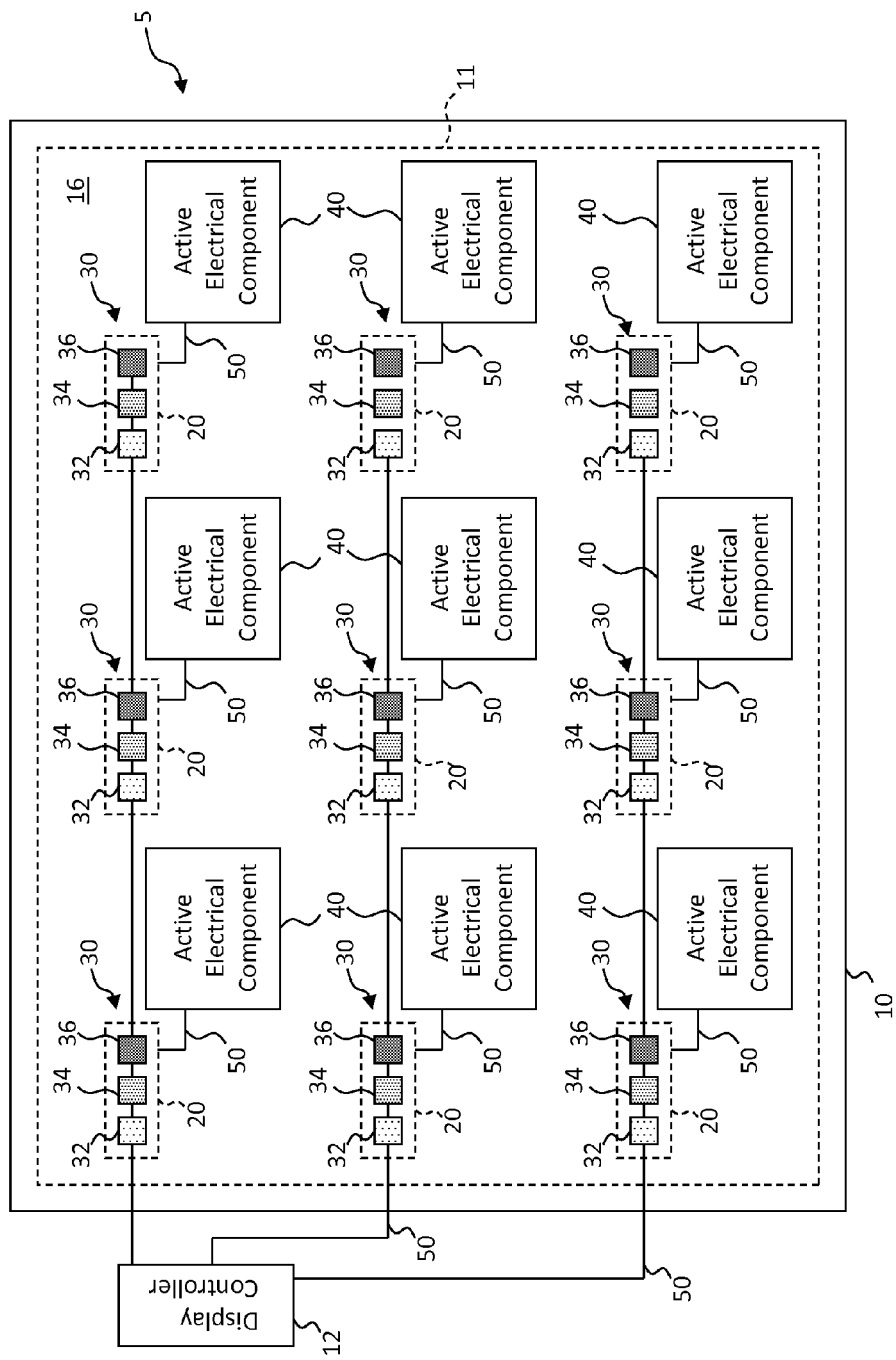
FIG. 1 is a plan view and FIG. 2 is a perspective of an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Figure 2:
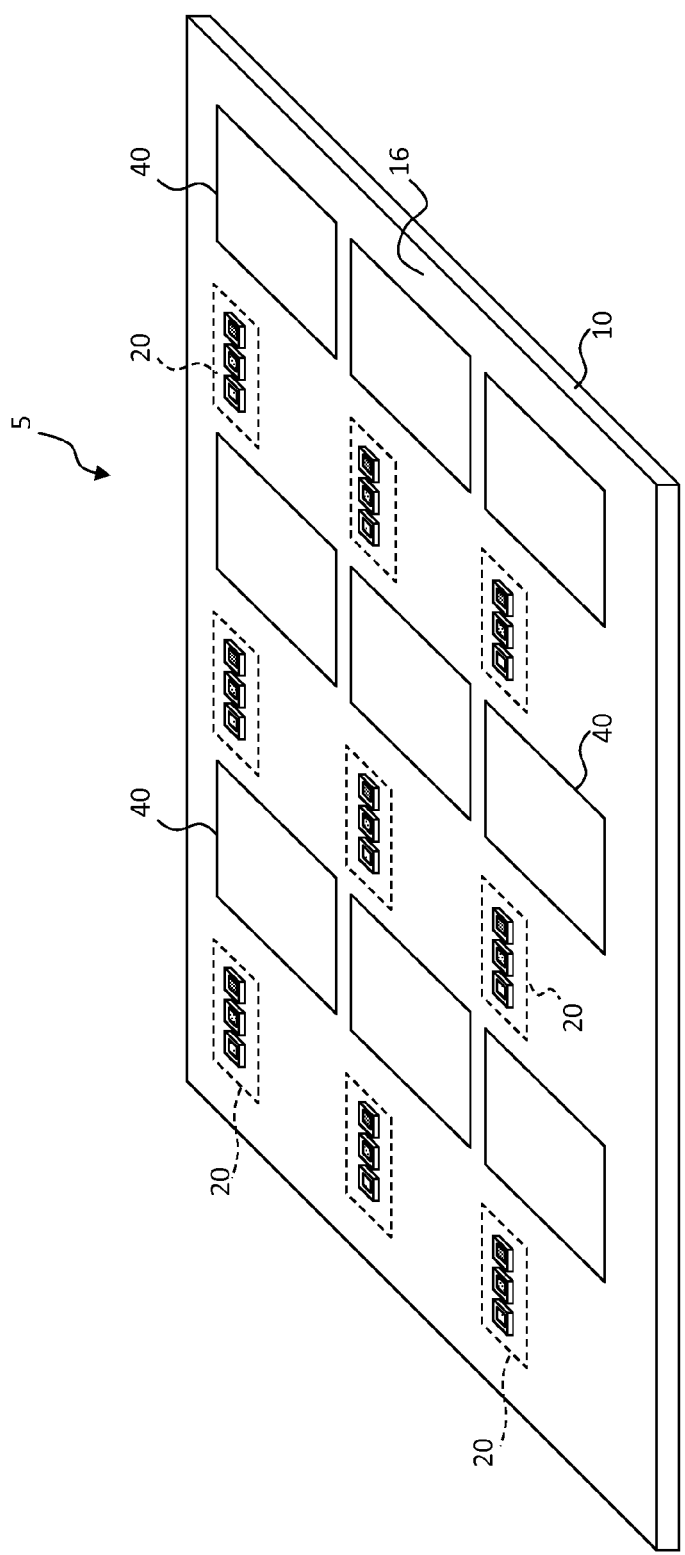

Referring to the plan view of FIG. 1 and the perspective of FIG. 2, in an embodiment of the present invention a small-aperture-ratio display 5 includes a display substrate 10. A plurality of spatially separated pixel elements 20 are distributed over the display substrate 10, each pixel element 20 including one or more light emitters 30. As illustrated in FIG. 1, the light emitters 30 include a red light emitter 32, a green light emitter 34, and a blue light emitter 36 in each pixel element 20. In some embodiments, additional light emitters are includes, such as a yellow light emitter. An active electrical component 40 is electrically connected to each of the pixel elements 20, each active electrical component 40 located on the display substrate surface 16 or in the display substrate 10 at least partly between the pixel elements 20.

The active electrical components 40 provide additional functionality to the small-aperture-ratio display 5 without compromising the image quality of the small-aperture-ratio display 5, for example, without reducing the resolution, lifetime, or brightness of the small-aperture-ratio display 5. As used herein, an active electrical component 40, in some embodiments, stores or releases energy, provides an electrical signal independent of other devices, detects and electrically responds to the environment (e.g. in response to electrical, optical, or mechanical stimulation), or responds to or emits electromagnetic radiation. The active electrical component 40 can be a multi-functional component. For example, the active electrical component 40 can include multiple active electrical elements. According to the present invention, the active electrical component 40 does not only passively conduct a signal, power, or ground reference from one location or pixel element 20 to another on the display substrate 10. For example, in an embodiment, the electrical component is an analog electrical component or circuit. In another embodiment the electrical component is a digital electrical component or circuit.

Figure 5:
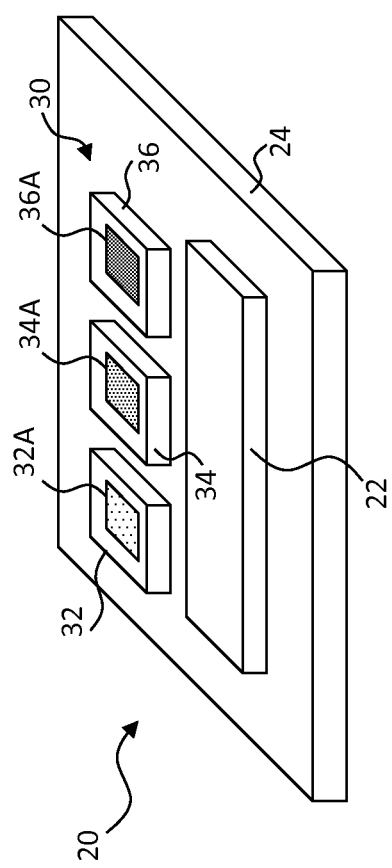
FIG. 5 is a perspective of a pixel element in an embodiment of the present invention.

The display substrate 10 has a contiguous display substrate area 11 that includes the pixel elements 20 and the light emitters 30 each have a light-emissive area (e.g. red light-emissive area 32A, green light-emissive area 34A, and blue light-emissive area 36A as shown in FIG. 5). The display substrate area 11 can include the entire display substrate surface 16 of the display substrate 10 or can include only a single, connected, contiguous portion of the display substrate surface 16 that includes all of the pixel elements 20. The combined light-emissive areas of the light emitters 30 is less than or equal to one-quarter of the display substrate area 11. For example, in embodiments that use red, green, and blue LEDs, the combined light-emissive area is the sum of the red, green, and blue light-emissive areas 32A, 34A, 36A. In some embodiments, the combined light-emissive areas of the light emitters is less than or equal to one eighth, one tenth, one twentieth, one fiftieth, one hundredth, one five-hundredth, one thousandth, one two-thousandth, or one ten-thousandth of the display substrate area. In some embodiments, the combined light-emissive areas of the light emitters is from one fiftieth to one two hundredth of the display substrate area. The light-emissive area of the light emitter 30 can be only a portion of the light emitter 30. In a typical light-emitting diode, for example, not all of the semiconductor material in the light-emitting diode necessarily emits light.

According to various embodiments, the small-aperture ratio display 5 of the present invention includes a variety of designs having a variety of resolutions, light emitter 30 sizes, and displays having a range of display substrate areas 11. For example, display substrate areas 11 ranging from 1 cm by 1 cm to 1 m by 1 m in size are contemplated. Light emitters 30 can have a size of one square micron to 500 square microns (e.g., a height, length, or width from 2 to 5 µm, 4 to 10 µm, 10 to 20 µm, or 20 to 50 µm). In general, larger light emitters 30 are most useful, but are not limited to, larger display substrate areas 11. The resolution of light emitters 30 over a display substrate 10 can also vary, for example from 50 light emitters 30 per inch to hundreds of light emitters 30 per inch, or even thousands of light emitters 30 per inch. For example, a three-color display having one thousand 10μ×10μ light emitters 30 per inch (on a 25-micron pitch) has an aperture ratio of less than 16 percent (including only the light emitters 30). Thus, the present invention has application in both low-resolution and very high-resolution displays. An approximately one-inch 128 by 128 pixel display having 3.5 micron by 10-micron emitters has been constructed and successfully operated as described in U.S. Patent Application Ser. No. 62/148,603 filed Apr. 16, 2015, entitled Micro-Assembled Micro LED Displays and Lighting Elements. This display has an aperture ratio (including only the light emitters) of less than 1.0%.

According to embodiments of the present invention, the display substrate 10 can include layers formed on an underlying structure or substrate, for example a rigid or flexible glass or plastic substrate. In one embodiment, the light emitters 30 are formed in a layer on the display substrate 10 so that the light emitters 30 are native to the display substrate 10. In another embodiment, the light emitters 30 are transferred from another substrate (such as a semiconductor wafer) to the display substrate 10 so that the light emitters 30 are non-native to the display substrate 10.

As shown in FIG. 1, the light emitters 30 are electrically connected to one or more electrically conductive wires 50 that electrically connect two or more of the pixel elements 20 and conduct power, a ground reference voltage, or signals for controlling the pixel elements 20 and the light emitters 30. In an embodiment, the conductive wires 50 are connected to a display controller 12 that is external to the display substrate 10. In an alternative embodiment, not shown, the display controller 12 is located on the display substrate 10 outside the display substrate area 11. The display controller 12 controls the small-aperture-ratio display 5 by, for example, providing power, a ground reference signal, and control signals. For clarity of illustration, the conductive wires 50 and display controller 12 are omitted from the perspective of FIG. 2.

As shown in FIGS. 1 and 2, the pixel elements 20 form a regular array on the display substrate 10. Each pixel element 20 can include a single light emitter 30 or, as shown in FIG. 1, each pixel element 20 includes at least three light emitters 30, each of the at least three light emitters 30 emitting light of different colors, for example red, green, and blue. Alternatively, at least some of the pixel elements 20 have an irregular arrangement on the display substrate 10.

Figure 3:
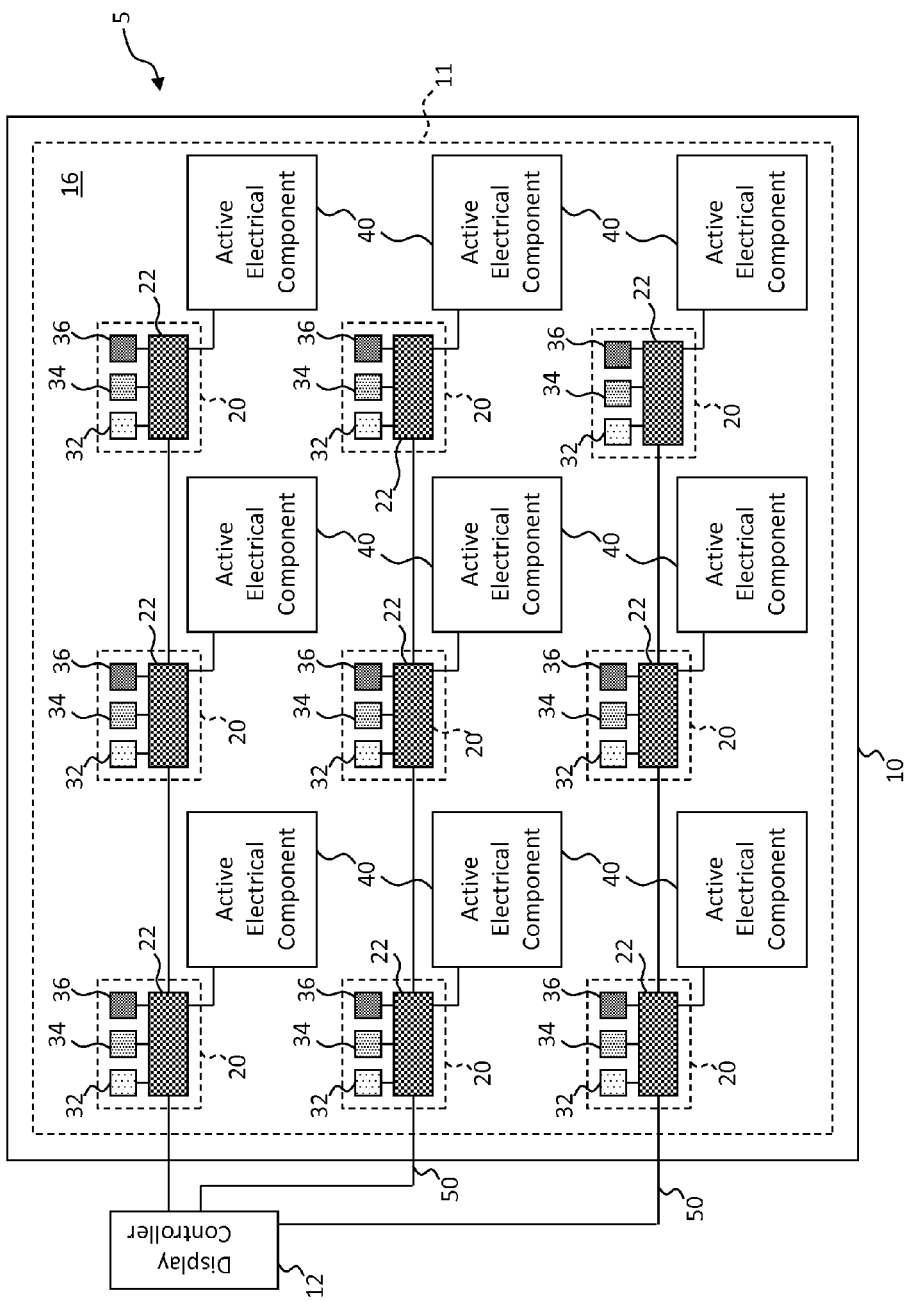
FIG. 3 is a plan view and FIG. 4 is a perspective of another embodiment of the present invention.
Figure 4:
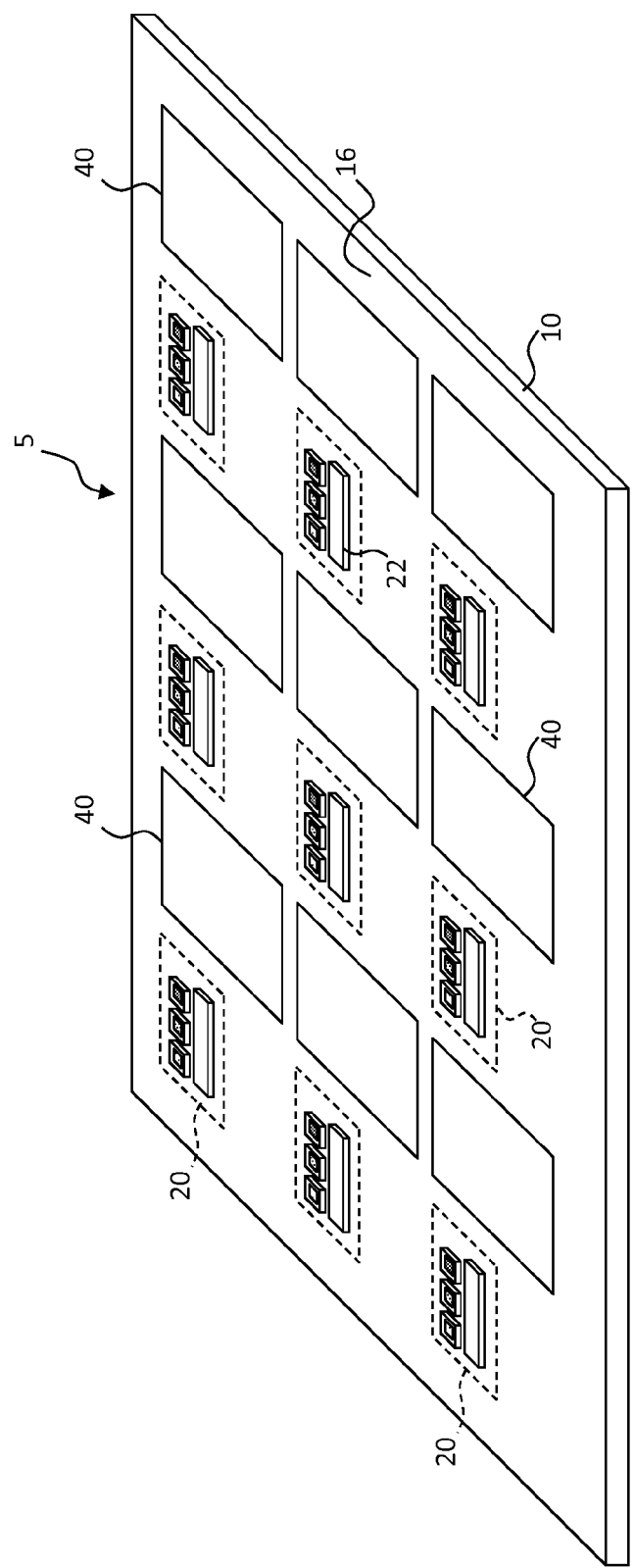

Referring to the plan view of FIG. 3 and the perspective of FIG. 4, in a further embodiment of the small-aperture-ratio display 5 of the present invention, each pixel element 20 in the display substrate area 11 further includes a pixel controller 22. The pixel controller 22 is electrically connected to the active electrical component 40 and to the one or more light emitters 30 (for example the red light emitter 32, the green light emitter 34, and the blue light emitter 36) to control the light output of the one or more light emitters 30 and to control the active electrical component 40, for example in response to control signals from the display controller 12 through the conductive wires 50.

In an embodiment, the pixel controller 22 or the light emitters 30 are formed in or located on the display substrate surface 16. For example, the light emitters 30 or the pixel controller 22 are located in a semiconductor layer formed over the extent of the display substrate 10, for example a layer of semi-crystalline polysilicon. In this embodiment, the components of the pixel element 20 are formed in the semiconductor layer and processed, for example using photolithographic processes, to form the pixel controller 22 or the light emitters 30. Such a structure can be constructed using conventional photolithographic processes found in the integrated circuit and flat-panel display industries.

Alternatively, the pixel controller 22 or the light emitters 30 are formed in substrates or on supports separate from the display substrate 10. For example, the light emitters 30 or the pixel controller 22 are separately formed in a semiconductor wafer. The light emitters 30 or the pixel controller 22 are then removed from the wafer and transferred, for example using micro transfer printing, to the display substrate 10. This arrangement has the advantage of using a crystalline silicon substrate that provides higher-performance integrated circuit components than can be made in the amorphous or polysilicon semiconductor available on a large substrate such as the display substrate 10.

Figure 6:
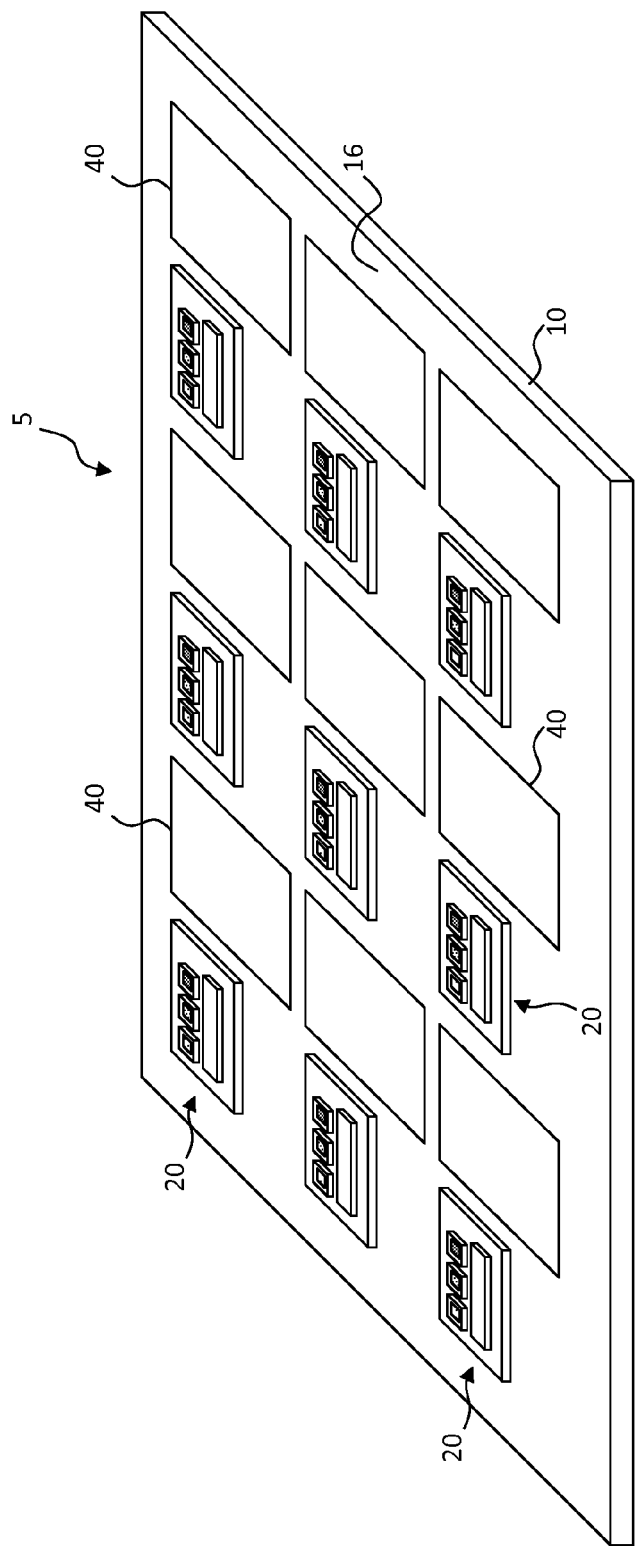
FIG. 6 is a perspective of an embodiment of the present invention incorporating the pixel element illustrated in FIG. 5.

Referring next to the perspectives of FIGS. 5 and 6, in an alternative embodiment the light emitters 30 or the pixel controller 22 are located on or in a pixel substrate 24 smaller than and separate and distinct from the display substrate 10. Compound micro-assembly is used to assemble light emitters 30 on a pixel substrate 24 to form a pixel element 20 and the pixel element 20 is then printed to the display substrate 10. In some embodiments, other devices, for example controllers, are also printed to the pixel substrate 24 to form the pixel element 20. A discussion of compound micro-assembly structures and methods is provided in U.S. Patent Application Ser. No. 62/055,472 filed Sep. 25, 2014, entitled Compound Micro-Assembly Strategies and Devices.

In such an embodiment the display substrate 10 can include material, for example glass or plastic, different from a material in the semiconductor substrate, for example a semiconductor material such as silicon. As shown in FIGS. 5 and 6, the pixel elements 20 or the pixel controller 22 are located on the pixel substrate 24 and the pixel substrate 24 is separately located on the display substrate 10. In such an embodiment, the pixel controller 22 or the light emitters 30 can be formed separately on separate semiconductor substrates, assembled onto the pixel substrate 24, and then the assembled unit is located on the display substrate surface 16. This arrangement has the advantage that the pixel elements 20 can be separately tested before they are located on the display substrate surface 16, thus improving yields and reducing costs.

In an embodiment of the present invention, the light emitters 30 are micro-light-emitting diodes (micro-LEDs), for example having light-emissive areas of less than 10, 20, 50, or 100 square microns. In some embodiments, the micro-LEDs have a height, length, and/or width from 2 to 5 μm, 4 to 10 μm, 10 to 20 μm, or 20 to 50 μm). Such micro-LEDs have the advantage of a small light-emissive area compared to their brightness as well as color purity providing highly saturated display colors and a substantially Lambertian emission providing a wide viewing angle for the small-aperture-ratio display 5 of the present invention. In various embodiments, the display substrate area 11 is greater than or equal to eight times, ten times, twenty times, fifty times, one hundred times, two hundred times, five hundred times, one thousand, or ten thousand times the combined light-emissive areas of the light emitters 30. For example, if the red light-emissive area 32A was 50-microns square, the green light-emissive area 34A was 30-microns square, and blue light-emissive area 36A was 40-microns square, the combined light-emissive areas of the light emitters 30 would be 120-microns square.

In various embodiments, the active electrical component 40 is an inductor, a capacitor, an integrated capacitive charge pump, a force-sensitive element, a transistor, a thin-film transistor, a circuit, a logic circuit, a power circuit, or an antenna. According to useful embodiments of the present invention, the active electrical component 40 provides additional functionality to the small-aperture-ratio display 5 that can be otherwise difficult to integrate into a display without adding additional layers (reducing display transparency) and electronics (increasing cost and interconnection complexity). For example, an inductor is useful for providing wireless power, energy harvesting, RF communications, or an RFID. The power circuit and integrated capacitive charge pump can provide an efficient means of powering the light emitters 30. In one embodiment, the active electrical component 40 is a force-sensitive element that incorporates a piezo-electric or piezo-ionic element and is useful, for example, in haptic devices. The active electrical component 40 can include analog or digital transistors forming electrical circuits, for example thin-film transistors forming a logic or control circuit to provide additional functionality to the small-aperture-ratio display 5 of the present invention.

Figure 7:
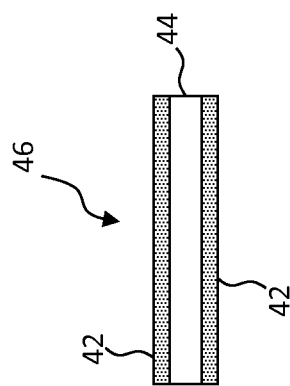
FIG. 7 is a cross section of an active electronic component capacitor in an embodiment of the present invention.

Referring to FIG. 7, in another embodiment the active electrical component 40 is a capacitor 46 that stores a charge, for example corresponding to a luminance of at least one of the one or more light emitters 30 of the pixel element 20 to which the capacitor 46 is electrically connected or providing a component in a power circuit, such as an integrated capacitive charge pump. The capacitor 46 includes conductive layers 42, for example metal or transparent metal oxide layers provided on opposing sides of a dielectric layer 44. Such a capacitor structure can enable active-matrix control of, or supply power to, the light emitters 30.

Figure 8:
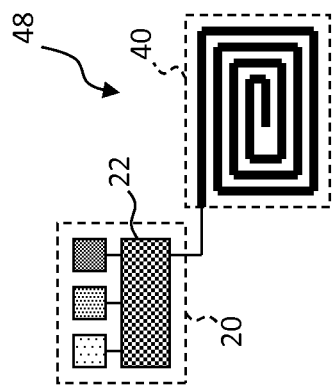
FIG. 8 is a plan view of a pixel element and active electronic component in an embodiment of the present invention.

In yet another embodiment, the active electrical component 40 is an inductor or integrated capacitive charge pump and each pixel element 20 further includes a power-control circuit, for example in the pixel controller 22, providing power to the one or more light emitters 30, the power-control circuit electrically connected to the inductor or integrated capacitive charge pump. Alternatively, as shown in FIG. 8, the active electrical component 40 is an antenna 48. In an embodiment, the antennas 48 form a beam-steering antenna array. The antennas 48 can be electrically controlled by the pixel controller 22 of the pixel element 20. In applications, for example for military systems, it can be useful to have both a display and a means of transmitting or receiving information from a particular direction, for example to improve the signal-to-noise ratio or to provide security. A display integrated with a beam-steering antenna array can provide both functions in one structure, reducing the size and the number of elements in a communication-and-display system.

Figure 12:
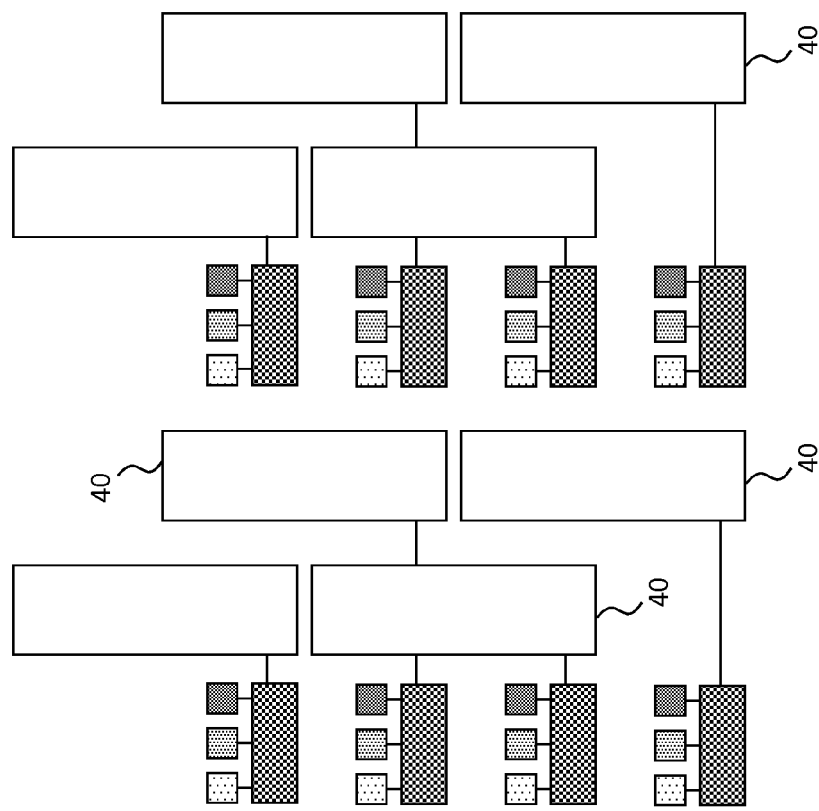

In a useful embodiment, and as shown in FIGS. 1-4 and 6, the active electrical component 40 corresponding to each pixel element 20 is located within an area bounded by the neighboring pixel elements 20 adjacent to each pixel element 20. Such an arrangement enables the active electrical components 40 to be arranged in a regular array in association with the pixel elements 20 on the display substrate 10. In an alternative embodiment, each active electrical component 40 is located on the substrate 10 in an area that extends beyond the area bounded by pixel elements 20 that are neighbors to the pixel element 20 to which the active electrical component 40 is connected, for example as illustrated in FIG. 12.

In some embodiments of the present invention, all of the pixel elements 20 are identical. In another embodiment, some pixel elements are different from other pixel elements. Moreover, in an embodiment, the pixel elements 20 include an active electrical component controller 23. Referring to FIG. 13 a different pixel element 21 is illustrated that has red, green, blue and yellow light emitters 32, 34, 36, 38 while the other pixel element 20 has only red, green, and blue light emitters 32, 34, 36. Moreover, the different pixel element 21 does not include the active electrical component 40 or an active electrical component controller 23 and is therefore a non-component pixel element 21. Thus, in another embodiment of the present invention, the small-aperture-ratio display 5 further includes non-component pixel elements 21 that are not electrically connected to an active electrical component 40.

In yet another embodiment, non-light-emitting component elements 26 that are each electrically connected to an active electrical component 40 are included that do not include light emitters 30 or pixel elements 20 but do include an active electrical component controller 23. These different elements can be arranged in a regular repeating array, for example component elements 26 can alternate with pixel elements 20. In this arrangement, twice as many active electrical components 40 are provided as pixel elements 20. In another arrangement, pixel elements 20 alternate with different non-component pixel elements 21 so that twice as many pixel elements 20, 21 are provided as active electrical components 40. In this case, the yellow emitter 38 is also provided in only every other pixel element 20, 21. As will be appreciated by those knowledgeable in the art, a wide variety of combinations of the various elements can be used to provide a corresponding variety of small-aperture-ratio displays 5 with a corresponding variety of functions.

As illustrated in FIG. 13, the non-component pixel elements 21 are interspersed between the pixel elements 20 over the display substrate and the non-light-emitting component elements 26 are interspersed between the pixel elements 20 over the display substrate. In an alternative embodiment, the non-component pixel elements 21 or the non-light-emitting component elements 26 are provided only in different portions of the display substrate 10, for example the non-light-emitting component elements 26 could be provided in only a first portion of the display substrate 10 and the non-component pixel elements 21 could be provided in a second portion of the display substrate 10 that is different from the first portion.

In another embodiment of the invention illustrated in FIG. 14, two or more pixel elements 20 are connected to a common active electrical component 40. Alternatively, an active electrical component 40 is electrically connected to a pixel element 20 and to a non-light-emitting component element 26, as shown in FIG. 15.

In yet another embodiment, two or more of the active electrical components 40 are first and second active electrical components 40 and the first active electrical component 40 is different from the second active electrical component 40, providing a variety of different active electrical component functions. For example, different kinds of touch screens (e.g., optical and capacitive) can be integrated into a common small-aperture-ratio display 5. The different active electrical components 40 can be interspersed or restricted to different portions of the display substrate 10. The different active electrical components 40 can have different functionality, have a different size, or include different materials.

Figure 16:
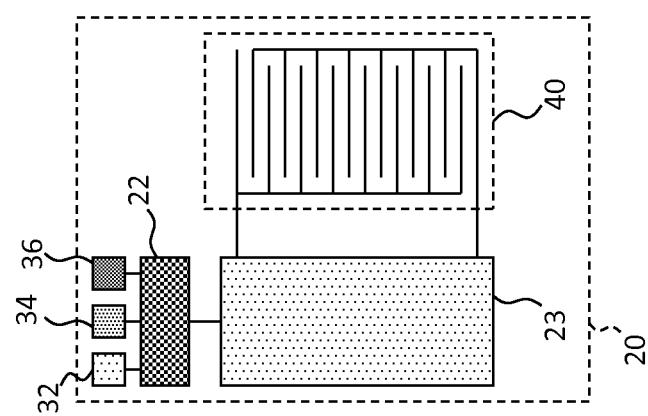

In yet another embodiment of the present invention, each pixel element 20 includes a pixel controller and the pixel controller is electrically connected to the active electrical component 40 and to the one or more light emitters 30 to control the light output by the one or more light emitters 30 and to control the active electrical component 40. The active electrical component 40 is a touch sensor and the pixel controller further includes a touch sensing circuit, for example in an active electrical component controller 23. The active electrical component 40 can be a capacitor forming a self-capacitance sensor or can include two electrical conductors forming a mutual-capacitance sensor as illustrated in FIG. 16.

In some embodiments of the present invention, the light emitters 30 emit light through the display substrate 10. In other embodiments, the light emitters 30 emit light in a direction opposite the display substrate 10.

The small-aperture-ratio display 5 of the present invention can be operated in a variety of useful ways. In one way, the display controller 12 provides power, a ground reference, and control signals to the pixel elements 20 in the small-aperture-ratio display 5 through the electrically conductive wires 50. The signals can provide a passive-matrix control of the light emitters 30 in the pixel elements 20 and can interact with the active electrical components 40 to provide functionality to the small-aperture-ratio display 5. In an alternative embodiment, the pixel elements 20 include the pixel controller 22. The display controller 12 is connected to the pixel controller 22 through the conductive wires 50 and provides control signals for operating the light emitters 30, for example in an active-matrix control configuration.

In a further embodiment, the pixel controller 22 is electrically connected to the active electrical component 40 through the conductive wires 50 to enable the functionality provided by the active electrical component 40. In one example, the pixel controller 22 includes power circuitry that is electrically connected to the active electrical component 40 to provide power to the light emitters 30. In another embodiment, the pixel controller 22 includes analog, digital, or mixed-signal circuitry that is electrically connected to the active electrical component 40. The pixel controller 22 can provide signals through the electrically conductive wires 50 to provide information to the display controller 12 and also can control the light emitters 30 to emit light in an imagewise fashion to provide a display, for example displaying images, graphics, text, or other information.

Figure 9:
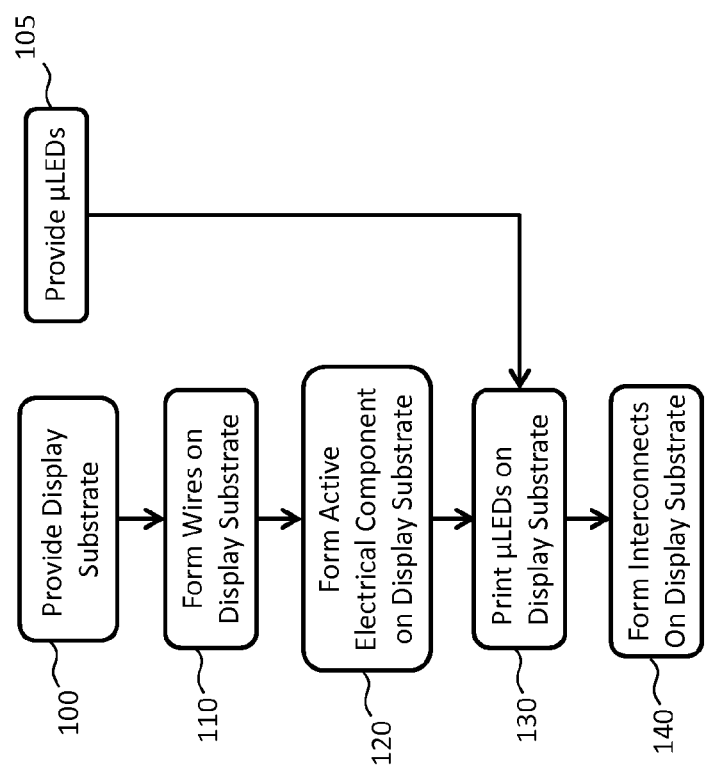

Referring to FIGS. 1 and 9, in a method of the present invention, the display substrate 10 is provided in step 100. The display substrate 10 can be any conventional substrate such as glass, plastic, or metal or include such materials. The display substrate 10 can be transparent, for example having a transmissivity greater than or equal to 50%, 80%, 90%, or 95% for visible light. The display substrate 10 usefully has two opposing smooth sides (such as display substrate surface 16) suitable for material deposition, photolithographic processing, or micro-transfer printing of micro-LEDs. The display substrate 10 can have a size of a conventional display, for example a rectangle with a diagonal of a few centimeters to one or more meters and a thickness of 0.1 mm, 0.5 mm, 1 mm, 5 mm, 10 mm, or 20 mm. Such substrates are commercially available. Before, after, or at the same time the light emitters 30 (e.g. micro-LEDs) are provided in step 105, using photolithographic integrated circuit processes on semiconductor substrates. The micro-LED semiconductor substrates are much smaller than and separate and distinct from the display substrate 10. In an alternative method, the controller and micro-LEDs are made in a semiconductor coating formed on the display substrate 10 using substrate processing methods, for example employing low- or high-temperature polysilicon processed, for example with excimer lasers to form localized crystalline silicon crystals (e.g. LTPS). The display controller 12 is made using photolithographic integrated circuit processes on semiconductor substrates, using analog, digital, or mixed-signal circuits.

In step 110 the conductive wires 50 and in step 120 the active electrical components 40 are formed on the display substrate 10 using photolithographic and display substrate processing techniques, for example photolithographic processes employing metal or metal oxide deposition using evaporation or sputtering, curable resin coatings (e.g. SU8), positive or negative photo-resist coating, radiation (e.g. ultraviolet radiation) exposure through a patterned mask, and etching methods to form patterned metal structures, vias, insulating layers, and electrical interconnections Inkjet and screen-printing deposition processes and materials can be used to form patterned conductors or other electrical elements. The methods can include forming capacitors, shaped conductors such as antennas or inductors, and digital, analog, or mixed-signal circuits.

Electrical interconnections, or wires, can be fine interconnections, for example having a width of less than 50 microns, less than 20 microns, less than 10 microns, less than five microns, less than two microns, or less than one micron. Alternatively, wires can include one or more crude lithography interconnections having a width from 2 μm to 2 mm, wherein each crude lithography interconnection is electrically connected to at least one of the plurality of pixel elements 30 on the display substrate 10.

In an embodiment, the light emitters 30 (e.g. micro-LEDs) formed in step 105 are transfer printed to the display substrate 10 in step 130 in one or more transfers. For a discussion of micro-transfer printing techniques see, U.S. Pat. Nos. 8,722,458, 7,622,367 and 8,506,867, each of which is hereby incorporated by reference. The transferred light emitters 30 are then interconnected in step 140 using similar materials and methods as in step 110, for example with conductive wires 50 and optionally including connection pads and other electrical connection structures, to enable the display controller 12 to electrically interact with the light emitters 30 to emit light in the small-aperture-ratio display 5. In an alternative process, the transfer or construction of the light emitters 30 is performed before or after all of the conductive wires 50 are in place. Thus, in embodiments the construction of the conductive wires 50 can be performed before the light emitters 30 are printed (in step 110 and omitting step 140) or after the light emitters 30 are printed (in step 140 and omitting step 110), or using both steps 110 and 140. In an embodiment, the display controller 12 is externally located (for example on a separate printed circuit board substrate) and electrically connected to the conductive wires 50 using connectors, ribbon cables, or the like. Alternatively, the display controller 12 is affixed to the display substrate 10 outside the display substrate area 11 and electrically connected to the conductive wires 50 using wires and buses, for example using surface mount and soldering technology (not shown).

Figure 10:
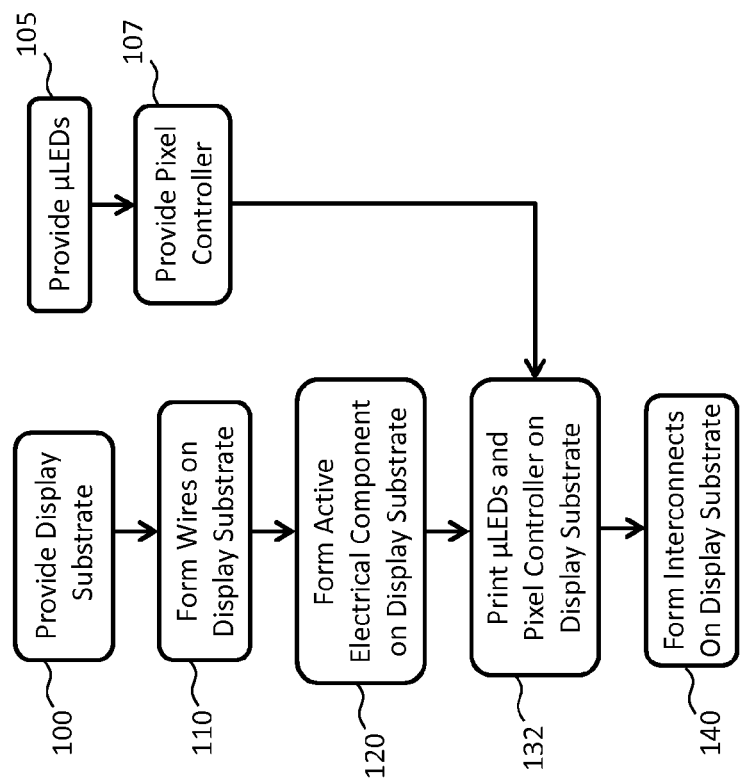
FIGS. 9-11 are flow charts illustrating methods of the present invention.

Referring to FIG. 10, in an alternative process and referring also to FIGS. 3 and 4, the pixel controller 22 is provided in step 107, for example using semiconductor integrated circuit processes. The pixel controller 22 can be provided at the same time as, before, or after the micro-LEDs, on separate semiconductor wafers, or on the same semiconductor wafer. In step 132, the light emitters 30 and the pixel controller 22 are transfer printed to the display substrate 10, either in a common transfer step or separate transfer steps from the same or different semiconductor wafers. The remaining steps 100, 110, 120, and 140 of FIG. 10 are the same as those described with respect to FIG. 9.

Figure 11:
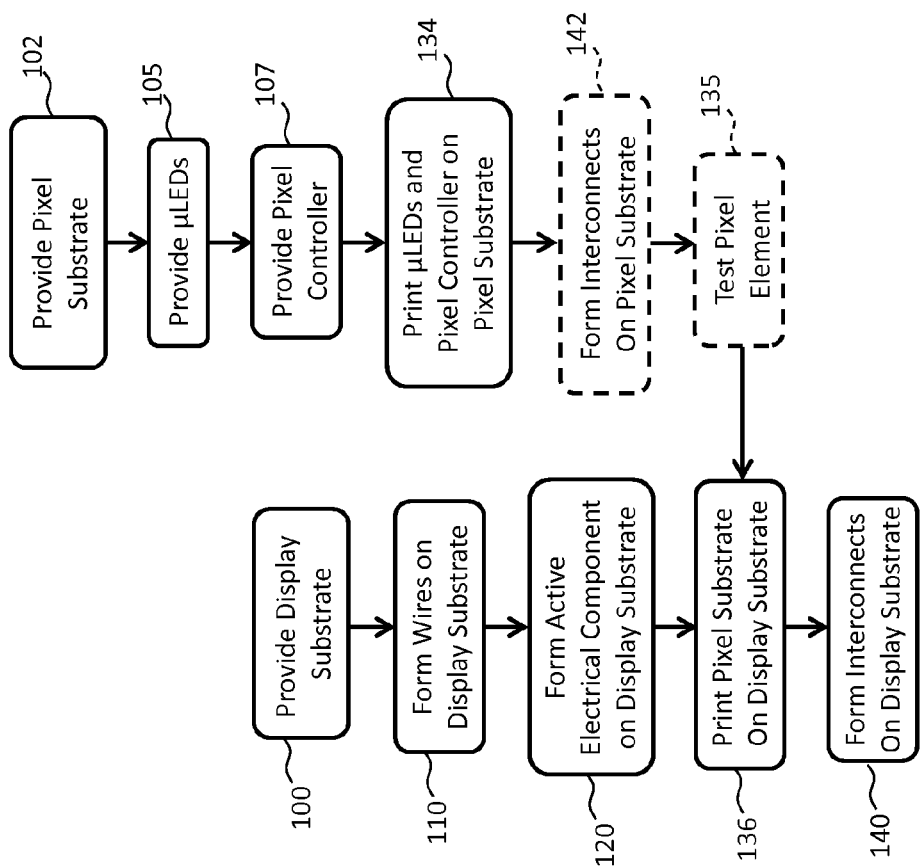

Referring to FIG. 11, in yet another process and referring also to FIGS. 5 and 6, the pixel substrate 24 is provided in step 102 in addition to providing the display substrate 10 (in step 100), providing the light emitters 30 (in step 105), and providing the pixel controller 22 (in step 107). The pixel substrate 24 can, for example, be similar to the display substrate 10 (e.g. made of glass or plastic) but in a much smaller size, for example having an area of 50 square microns, 100 square microns, 500 square microns, or 1 square mm and can be only a few microns thick, for example 5 microns, 10 microns, 20 microns, or 50 microns. The light emitters 30 (e.g. micro-LEDs) and the pixel controller 22 are transfer printed onto the pixel substrate 24 in step 134 using one or more transfers from one or more semiconductor wafers to form a pixel element 20 with a pixel substrate 24 separate from the display substrate 10, the substrate of the pixel controller 22, and the substrates of the light emitters 30. In an alternative embodiment, not shown, the pixel substrate 24 includes a semiconductor and the light emitters 30 and the pixel controller 22 and, optionally, some electrical interconnections, are formed in the pixel substrate 24. In optional step 142, the electrical interconnects are formed on the pixel substrate 24 to electrically interconnect the light emitters 30 and the pixel controller 22, for example using the same processes that are employed in steps 110 or 140. In optional step 135, the pixel elements 20 on the pixel substrates 24 are tested and accepted, repaired, or discarded. In step 136, the pixel elements 20 are transfer printed or otherwise assembled onto the display substrate 10 and then electrically interconnected in step 140 with the conductive wires 50 to the active electrical component 40 and to connection pads for connection to the display controller 12. The steps 102 to 107 can be performed in any order and before or after any of the steps 100, 110, or 120.

By employing the multi-step transfer or assembly process of FIG. 11, increased yields are achieved and thus reduced costs for the small-aperture-ratio display 5 of the present invention. Additional details useful in understanding and performing aspects of the present invention are described in U.S. Patent Application Ser. No. 62/148,603 filed Apr. 16, 2015, entitled Micro-Assembled Micro LED Displays and Lighting Elements.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST 5 small-aperture-ratio display
10 display substrate
11 display substrate area
12 display controller
16 display substrate surface
20 pixel element
21 non-component pixel element
22 pixel controller
23 active electrical component controller
24 pixel substrate
26 non-light-emitting component element
30 light emitter
32 red light emitter
32A red light-emissive area
34 green light emitter
34A green light-emissive area
36 blue light emitter
36A blue light-emissive area
38 yellow light emitter
40 active electrical component
42 conductive layer
44 dielectric layer
46 capacitor
48 antenna
50 conductive wire
100 provide display substrate step
102 provide pixel substrate step
105 provide light emitters step
107 provide pixel controller step
110 form wires on substrate step
120 form active electrical component on display substrate step
130 print micro-LEDs on display substrate step
132 print micro-LEDs and pixel controller on display substrate step
134 print micro-LEDs and pixel controller on pixel substrate step
135 optional test pixel element step
136 print pixel substrate on display substrate step
140 form interconnects on display substrate step
142 optional form interconnects on pixel substrate step

What is claimed:

1. A small-aperture-ratio display, comprising:
a display substrate;
a plurality of spatially separated pixel elements distributed in a regular array over the display substrate, each pixel element comprising one or more light emitters, a pixel controller for controlling light emission of the one or more light emitters, and a light-emissive area that consists of all of the areas that emit light within the pixel element, wherein the plurality of pixel elements comprise all of the light-emissive areas over the display substrate and each of the pixel controllers is disposed at least partially directly between the one or more light emitters of different pixel elements of the plurality of spatially separated pixel elements such that the pixel controller and the one or more light emitters in each pixel element lie on a common plane;

a plurality of active electrical components located on the display substrate at least partly directly between the pixel elements, such that the pixel elements and the plurality of active electrical components lie on a common plane, each active electrical component electrically connected to one or more of the pixel elements; and wherein the display substrate has a contiguous display substrate area, determined as the minimum area containing all of the plurality of spatially separated pixel elements, and the combined light-emissive areas of all of the pixel elements are less than or equal to one-eighth of the contiguous display substrate area.

2. The small-aperture-ratio display of claim 1, wherein at least one of the plurality of active electrical components is an inductor, a capacitor, an integrated capacitive charge pump, a force-sensitive element, a transistor, a thin-film transistor, a circuit, a logic circuit, a power circuit, a solar cell, an antenna, or a multi-functional electrical component, or comprises multiple active electrical elements.

3. The small-aperture-ratio display of claim 2, wherein the at least one of the plurality of active electrical components is a force-sensitive element and the force-sensitive element is a piezo-electric or piezo-ionic element.

4. The small-aperture-ratio display of claim 2, wherein the capacitor stores a charge corresponding to a luminance of at least one of the one or more light emitters of the pixel element to which the capacitor is electrically connected.

5. The small-aperture-ratio display of claim 1, wherein each pixel element comprises a single light emitter.

6. The small-aperture-ratio display of claim 1, wherein each pixel element comprises at least three light emitters, each of the at least three light emitters emitting light of different colors.

7. The small-aperture-ratio display of claim 1, comprising a plurality of pixel substrates on the display substrate and wherein each of the plurality of pixel elements is located on one of the plurality of pixel substrates.

8. The small-aperture-ratio display of claim 1, wherein each pixel controller is electrically connected to an active electrical component of the plurality of active electrical components and to the one or more light emitters to control the light output by the one or more light emitters and to control the active electrical component.

9. The small-aperture-ratio display of claim 8, wherein the pixel controller is located on the display substrate.

10. The small-aperture-ratio display of claim 1 comprising one or more conductive wires electrically connecting two or more of the pixel elements.

11. The small-aperture-ratio display of claim 10, wherein the one or more conductive wires conduct signals for controlling the pixel elements, for conducting power to the pixel elements, or for providing a ground reference voltage.

12. The small-aperture-ratio display of claim 1, wherein the active electrical component is an inductor or integrated capacitive charge pump and each pixel element comprises a power-control circuit providing power to the one or more light emitters, the power-control circuit electrically connected to the inductor or integrated capacitive charge pump.

13. The small-aperture-ratio display of claim 1, wherein the combined light-emissive areas of the one or more light emitters are less than or equal to one twentieth of the contiguous display substrate area.

14. The small-aperture-ratio display of claim 1, wherein each active electrical component is an antenna and the antennas form a beam-steering antenna array.

15. The small-aperture-ratio display of claim 1, wherein the active electrical component corresponding to each pixel element is located within an area on the display substrate bounded by the neighboring pixel elements adjacent to each pixel element.

16. The small-aperture-ratio display of claim 1, wherein the one or more light emitters are formed in a layer on the display substrate or the one or more light emitters are located on the display substrate.

17. The small-aperture-ratio display of claim 1, comprising a plurality of pixel substrates, each pixel substrate separate from the display substrate and wherein each of the one or more light emitters is formed in a layer on the pixel substrate or located on the pixel substrate.

18. A small-aperture-ratio display, comprising:
a display substrate having a plurality of spatially separated light-emissive areas that correspond to a plurality of light emitters and a contiguous display substrate area that is the convex hull of all of the spatially separated light-emissive areas, wherein the combined area of the spatially separated light-emissive areas is less than or equal to one-eighth of the contiguous display substrate area.

19. The small-aperture-ratio display of claim 18, wherein the combined area of the spatially separated light-emissive areas is less than or equal to one hundredth of the contiguous display substrate area.

20. The small-aperture-ratio display of claim 18, wherein the combined area of the spatially separated light-emissive areas is less than or equal to one five-hundredth of the contiguous display substrate area.

21. A small-aperture-ratio display, comprising:
a display substrate;
a plurality of spatially separated pixel elements distributed over the display substrate, each pixel element comprising one or more light emitters, a pixel controller for controlling light emission of the one or more light emitters, and a light-emissive area that consists of all of the areas that emit light within the pixel element, wherein the plurality of pixel elements comprise all of the light-emissive areas over the display substrate and each of the pixel controllers is disposed at least partially between the one or more light emitters of different pixel elements of the plurality of spatially separated pixel elements such that the pixel controller and the one or more light emitters in each pixel element lie on a common plane;
a plurality of active electrical components located on the display substrate at least partly between the pixel elements, each active electrical component electrically connected to one or more of the pixel elements; and
wherein the display substrate has a contiguous display substrate area that includes all of the plurality of spatially separated pixel elements, and the combined light-emissive areas of all of the pixel elements are less than or equal to one-eighth of the contiguous display substrate area,
wherein each pixel controller is electrically connected to an active electrical component of the plurality of active electrical components and to the one or more light emitters to control the light output by the one or more light emitters and to control the active electrical component; and comprising a pixel substrate separate from the display substrate and wherein the pixel controller is located entirely on the pixel substrate.

22. A small-aperture-ratio display, comprising:

a display substrate;

a plurality of spatially separated pixel elements distributed over the display substrate, each pixel element comprising one or more light emitters, a pixel controller for controlling light emission of the one or more light emitters, and a light-emissive area that consists of all of the areas that emit light within the pixel element, wherein the plurality of pixel elements comprise all of the light-emissive areas over the display substrate and each of the pixel controllers is disposed at least partially between the one or more light emitters of different pixel elements of the plurality of spatially separated pixel elements such that the pixel controller and the one or more light emitters in each pixel element lie on a common plane; and comprising a pixel substrate separate from the display substrate and wherein one or more of the pixel elements is located entirely on the pixel substrate and the pixel substrate is located on the display substrate;

a plurality of active electrical components located on the display substrate at least partly between the pixel elements, each active electrical component electrically connected to one or more of the pixel elements; and wherein the display substrate has a contiguous display substrate area that includes all of the plurality of spatially separated pixel elements, and the combined light-emissive areas of all of the pixel elements are less than or equal to one-eighth of the contiguous display substrate area.

* * * * *